United States Patent
Mizoguchi et al.

(10) Patent No.: US 8,163,411 B2
(45) Date of Patent: Apr. 24, 2012

(54) ABNORMALITY DETECTION APPARATUS FOR BATTERY PACK

(75) Inventors: Tomomichi Mizoguchi, Nagoya (JP); Yuuki Takemoto, Kariya (JP)

(73) Assignee: Denso Corporation, Kariya (JP)

( * ) Notice: Subject to any disclaimer, the term of this patent is extended or adjusted under 35 U.S.C. 154(b) by 720 days.

(21) Appl. No.: 12/269,301

(22) Filed: Nov. 12, 2008

(65) Prior Publication Data

US 2009/0130542 A1 May 21, 2009

(30) Foreign Application Priority Data

Nov. 21, 2007 (JP) ................................ 2007-302057
May 27, 2008 (JP) ................................ 2008-137798

(51) Int. Cl.
*H01M 2/00* (2006.01)
*H01M 10/48* (2006.01)
*H02J 7/00* (2006.01)

(52) U.S. Cl. .............. 429/61; 429/91; 429/90; 429/149; 320/134; 320/161; 700/292

(58) Field of Classification Search .................... 429/61, 429/90, 91, 92, 149, 150; 320/118, 120, 320/121, 134, 148, 149, 161; 700/286, 292, 700/297

See application file for complete search history.

(56) References Cited

U.S. PATENT DOCUMENTS

| 6,081,095 A | 6/2000 | Tamura et al. |
| 6,977,483 B2 | 12/2005 | Iwashima |
| 2004/0115519 A1* | 6/2004 | Lee .................................. 429/61 |

FOREIGN PATENT DOCUMENTS

| JP | 2000-083327 | 3/2000 |
| JP | 2004-104989 | * 4/2004 |

OTHER PUBLICATIONS

Japanese Office Action dated Jun. 8, 2010, issued in corresponding Japanese Application No. 2008-297130, with English translation.

* cited by examiner

*Primary Examiner* — Raymond Alejandro
(74) *Attorney, Agent, or Firm* — Nixon & Vanderhye P.C.

(57) ABSTRACT

The abnormality detection apparatus for a battery pack includes a first determining function of making a first determination that abnormality is present when a voltage across a unit battery of interest is higher than a first threshold, a second determining function of making a second determination that abnormality is present when the voltage is lower than a second threshold lower than the first threshold, a short-circuit function of making a short-circuit between a detection line of interest connected to one electrode of a unit battery of interest and an adjacent detection line connected to the other electrode of the unit battery, and a third determining function of making a third determination that there is faulty electrical continuity in the detection line of interest if the first determining function makes the first determination and the second determining function makes the second determination when the short circuit function makes the short-circuit.

30 Claims, 24 Drawing Sheets

| | Vi | | |
|---|---|---|---|
| HIGH | 98c ON | 98b ON | 98a ON |
| ↕ Vn | 1 | 1 | 1 |
| | 0 | 1 | 1 |
| | 0 | 0 | 1 |
| LOW | 0 | 0 | 0 |

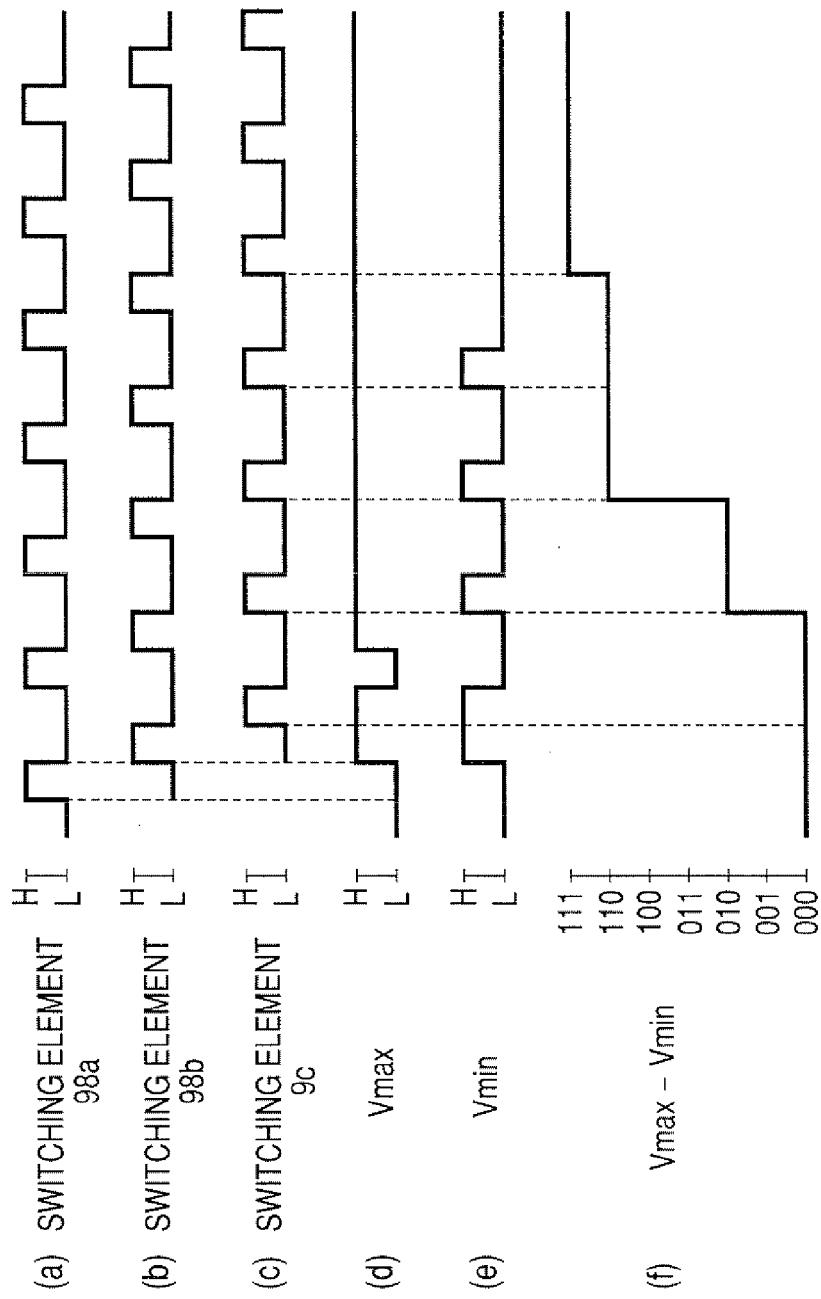

ABNORMALITY DETECTION APPARATUS FOR BATTERY PACK

CROSS-REFERENCE TO RELATED APPLICATION

This application is related to Japanese Patent Applications No. 2007-302057 filed on Nov. 21, 2007, and No. 2008-137798 filed on May 27, 2008, the contents of which are hereby incorporated by reference.

BACKGROUND OF THE INVENTION

1. Field of the Invention

The present invention relates to an abnormality detection apparatus for a battery pack including a plurality of unit batteries each of which is constituted by one, or adjacent two or more of battery cells, the apparatus being connected through detection lines to both electrodes of each of the unit batteries, and configured to detect a voltage across each of the unit batteries on the basis of voltages between each two adjacent detection lines.

2. Description of Related Art

FIG. 27 is diagram showing a part of an equivalent circuit of such an abnormality detection apparatus described in Japanese Patent No. 3603901. As shown in this figure, in this abnormality detection apparatus, an overcharge detecting circuit 110 and an overdischarge detecting circuit 120 are parallel-connected to each of battery cells Cn, C(n−1), C(n−2) constituting a battery pack. The overcharge detecting circuit 110 and the overdischarge detecting circuit 120 are respectively for determining whether or not the voltage across a corresponding battery cell is excessively high or excessively low. If the overcharge detecting circuit 110 detects an overcharge, the detection result is outputted to an OR circuit 132. On the other hand, if the overdischarge detecting circuit 120 detects an overdischarge, the detection result is outputted to an OR circuit 134. The outputs of the OR circuit 132 and the OR circuit 134 are logically combined by an OR circuit 136. By referring to the output of the output of the OR circuit 136, it is possible to determine presence of an overcharge condition or an overdischarge condition.

The above apparatus is provided with switching elements SWn, SW (n−1), SW (n−2). When one of these switching elements is turned on, both electrodes of a corresponding battery cell are short-circuited. In this state, if an overcharge or an overdischarge is detected, it can be determined that the detection line connected between the negative side electrode of the corresponding battery cell and a corresponding one of the overcharge detecting circuits 110 and the overdischarge detecting circuits 120 is broken. This determination is made on the basis of the fact that when the SWn, for example, is turned on, if the detection line Ln connected to the negative side electrode of the battery cell Cn is broken, the voltage of the detection line Ln is brought to the voltage of the detection line L(n+1) connected to the positive side electrode of the battery cell Cn.

However, the above conventional apparatus has a problem in that it is not possible to distinguish between breakage of the detection line and overcharge or overdischarge condition of the battery cell. Accordingly, when an abnormality is detected by this apparatus, it cannot be determined whether a part of the circuit structure of this apparatus should be replaced, or a battery pack should be replaced. Hence, there has been a problem that a normally operating battery pack is replaced unnecessarily, or a number of the detection lines are checked unnecessarily during a maintenance period.

SUMMARY OF THE INVENTION

The present invention provides an abnormality detection apparatus for a battery pack including a plurality of unit batteries each of which is constituted by one, or adjacent two or more of battery cells, the abnormality detection apparatus being connected through detection lines to both electrodes of each of the unit batteries, and configured to detect a voltage across each of the unit batteries on the basis of voltages between each two adjacent detection lines, the abnormality detection apparatus comprising:

a first determining function of making a first determination that abnormality is present when a voltage across a unit battery of interest is higher than a first threshold;

a second determining function of making a second determination that abnormality is present when the voltage across the unit battery of interest is lower than a second threshold lower than the first threshold;

a short-circuit function of making a short-circuit between a detection line of interest connected to one electrode of a unit battery of interest and an adjacent detection line connected to the other electrode of the unit battery of interest; and a third determining function of making a third determination that there is faulty electrical continuity in the detection line of interest if the first determining function makes the first determination and the second determining function makes the second determination when the short circuit function makes the short-circuit.

The present invention provides also provides an abnormality detection apparatus for a battery pack including a plurality of unit batteries each of which is constituted by one, or adjacent two or more of battery cells, the abnormality detection apparatus being connected through detection lines to both electrodes of each of the unit batteries, and configured to detect a voltage across each of the unit batteries on the basis of voltages between each two adjacent detection lines, the abnormality detection apparatus comprising:

a first function of detecting a voltage between a detection line of interest connected to one electrode of a unit battery of interest and an adjacent detection line connected to the other electrode of the unit battery of interest; and a second function of determining that the detection line of interest has faulty electrical continuity when the first function detects occurrence of polarity inversion between the detection line of interest and the adjacent line.

According to the present invention, it is possible to provide an abnormality detection apparatus for a battery pack capable of reliably detecting breakage or faulty electrical continuity of detection lines connected to both electrodes of each of the battery cells of the battery pack.

Other advantages and features of the invention will become apparent from the following description including the drawings and claims.

BRIEF DESCRIPTION OF THE DRAWINGS

In the accompanying drawings:

FIG. 19 is a time chart explaining a process to represent voltage variation of battery cells in digital form in the ninth embodiment of the invention;

PREFERRED EMBODIMENTS OF THE INVENTION

First Embodiment

Figure 1:
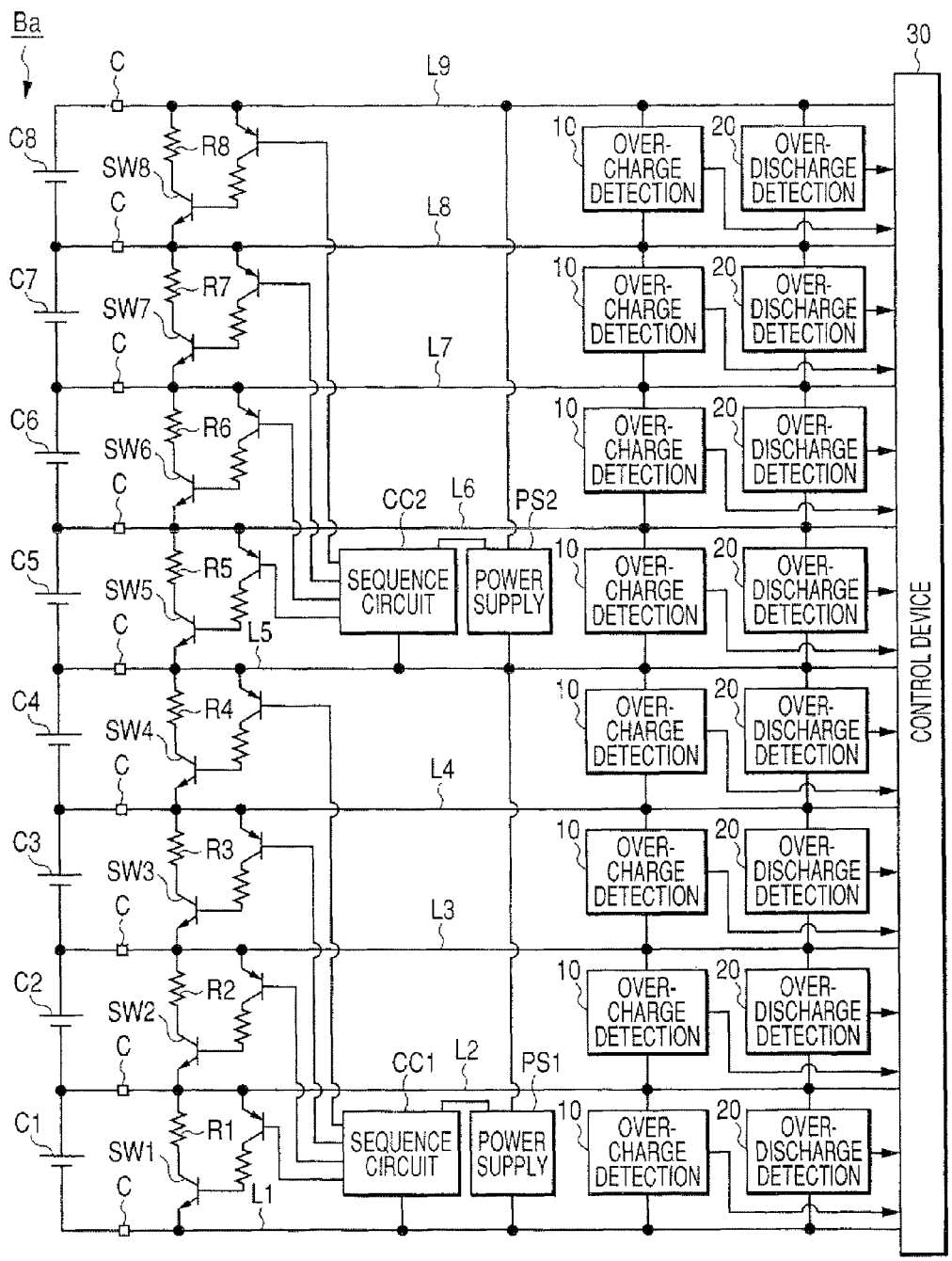
FIG. 1 is a diagram showing a system structure of an abnormality detection apparatus for a battery pack according to a first embodiment of the invention.

FIG. 1 is a diagram showing a system structure of an abnormality detection apparatus for a battery pack according to a first embodiment of the invention. In FIG. 1, Ba denotes a battery pack mounted on a hybrid vehicle. The battery pack Ba is charged with regenerated electric energy during regenerative control of the vehicle, and discharge electric energy during powering control of the vehicle. The battery pack Ba is constituted of a series connection of battery cells (lithium ion secondary batteries) C1 to C8. Although the battery pack Ba is described as having eight battery cells for the sake of simplicity of explanation in this embodiment, in practical cases, the number of battery cells constituting the battery pack may be far greater than eight to generate a required voltage. The battery cell Cn (n being an integer from 1 to 8) of the battery pack Ba is connected to a detection line Ln and a detection line L(n+1) at both electrodes thereof. A portion of the detection line Ln on the other side from a connector C is formed as a harness extending to the battery pack Ba, and the other portion is formed as wiring on a semiconductor substrate within the abnormality detection apparatus.

The abnormality detection apparatus includes a series connection of a resistor Rn and a switching element SWn connected between the detection line Ln and the connection line L(n+1). The switching element SWn is operated by a sequence circuit CC1 or CC2 powered by a power supply PS1 or PS2. The power supply CC1 generates a voltage for powering a first group of the switching elements SW1 to SW4. The power supply CC2 generates a voltage for powering a second group of the switching elements SW5 to SW8.

Between the detection line Ln and the detection line L(n+1), there are connected an overcharge detecting circuit 10 for detecting whether the battery cell Cn is in an overcharged state or not, and an overdischarge detecting circuit 20 for detecting whether the battery cell Cn is in an overdischarged state or not. The outputs of the overcharge detecting circuit 10 and the overdischarge detecting circuit 20 are taken in a control device 30.

Figure 2:
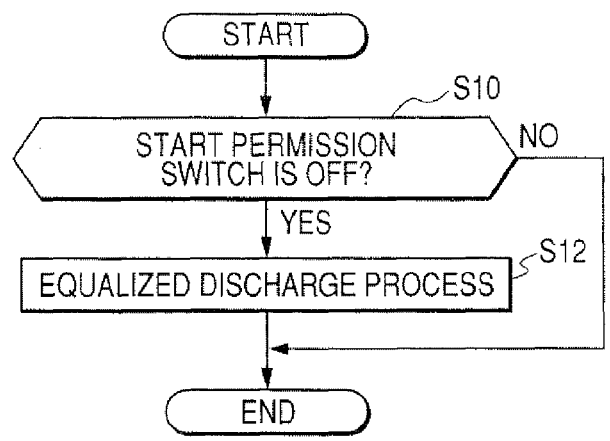
FIG. 2 is a flowchart showing a process of an equalized discharge process repeatedly performed by a control device included in the abnormality detection apparatus shown in FIG. 1.

The control device 30 performs a process to determine presence of an abnormality in the battery pack Ba on the basis of the outputs of the overcharge detecting circuits 10 and the overdischarge detecting circuits 20. In addition, the control device 30 performs an equalized discharge process to discharge the battery cells C1 to C8 so that they have an equal voltage, and accordingly, they have the same amount of charge. To perform this process, the control device 30 may have a circuit structure described in Japanese Patent Application Laid-open No. 2000-83327, for example. FIG. 2 is a flowchart showing the equalized discharge process repeatedly performed at regular time intervals by the control device 30.

This process starts by determining whether a start permission switch of the vehicle is in an off state at step S10. The start permission switch is a switch which permits the vehicle to move when the driver or user of the vehicle turns on this switch. The start permission switch may be a switch for making and breaking connection between a control device of a vehicle control system and a main power supply. If the determination result at step S10 is affirmative, the process proceeds to step S12 where charge is moved from at least one of the battery cells C1 to C8 having higher voltage to at least one of the battery cells C1 having lower voltage. When S12 is completed, or if the determination result at step S10 is negative, the process is terminated.

Figure 3A:
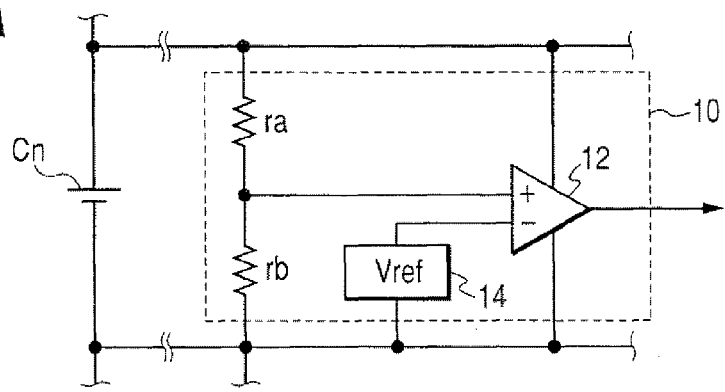
FIG. 3A is a diagram showing a circuit structure of an overcharge detecting circuit included in the abnormality detection apparatus shown in FIG. 1.
Figure 3B:
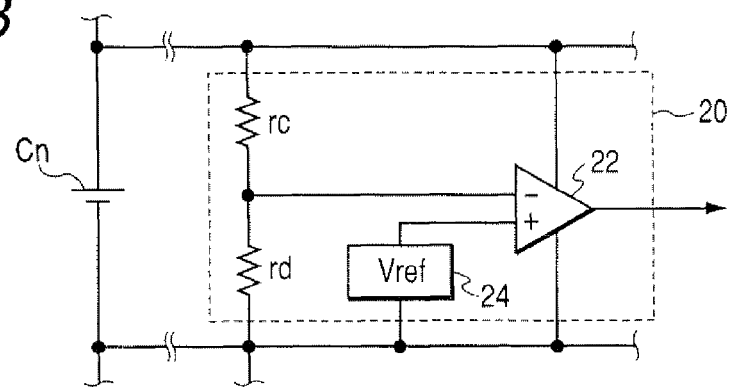
FIG. 3B is a diagram showing a circuit structure of an overdischarge detecting circuit included in the abnormality detection apparatus shown in FIG. 1.

FIG. 3A shows a circuit structure of the overcharge detecting circuit 10. FIG. 3B shows a circuit structure of the overdischarge detecting circuit 20. As shown in FIG. 3A, the overcharge detecting circuit 10 includes a series connection of a resistor ra and a resistor rb parallel-connected to the battery cell Cn. The voltage of a connection node between the resistors ra and rb, that is, the voltage of the battery cell Cn divided down by the resistors ra and rb is applied to the non-inverting input terminal of a comparator 12. On the other hand, the inverting-input terminal of the comparator 12 is applied with a reference voltage Vref with respect to the voltage at the negative side electrode of the battery cell Cn generated by a reference voltage source 14. Accordingly, when the voltage across the battery cell Cn is equal to or lower than an overcharge threshold VthH (=Vref·(ra+rb)/rb), the output of the comparator 12, that is, the output of the overcharge detecting circuit 10 is at logical Low or "L", and when the voltage across the battery cell Cn is higher than the overcharge threshold VthH, the output of the overcharge detecting circuit 10 is at logical High or "H". Here, ra and rb represent a resistance of the resistor ra and a resistance of the resistor rb, respectively.

As shown in FIG. 3B, the overdischarge detecting circuit 20 includes a series connection of a resistor rc and a resistor rd parallel-connected to the battery cell Cn. The voltage of a connection node between the resistors rc and rd, that is, the voltage of the battery cell Cn divided down by the resistors rc and rd is applied to the non-inverting input terminal of a comparator 22. On the other hand, the inverting-input terminal of the comparator 22 is applied with a reference voltage Vref with respect to the voltage at the negative side electrode of the battery cell Cn generated by a reference voltage source 24. Accordingly, when the voltage across the battery cell Cn is equal to or higher than an overdischarge threshold VthL (=Vref·(rc+rd)/rd), the output of the comparator 22, that is, the output of the overdischarge detecting circuit 20 is at logical "L", and when the voltage across the battery cell Cn is lower than the overdischarge threshold VthL, the output of the overdischarge detecting circuit 20 is at logical "H". Here, rc and rd represent a resistance of the resistor rc and a resistance of the resistor rd, respectively.

Since the overcharge threshold VthH is higher than the overdischarge threshold VthL, the resistances ra, rb, rc and rd satisfy a relationship of rb/(ra+rb)<rd/(rc+rd).

Figure 4:
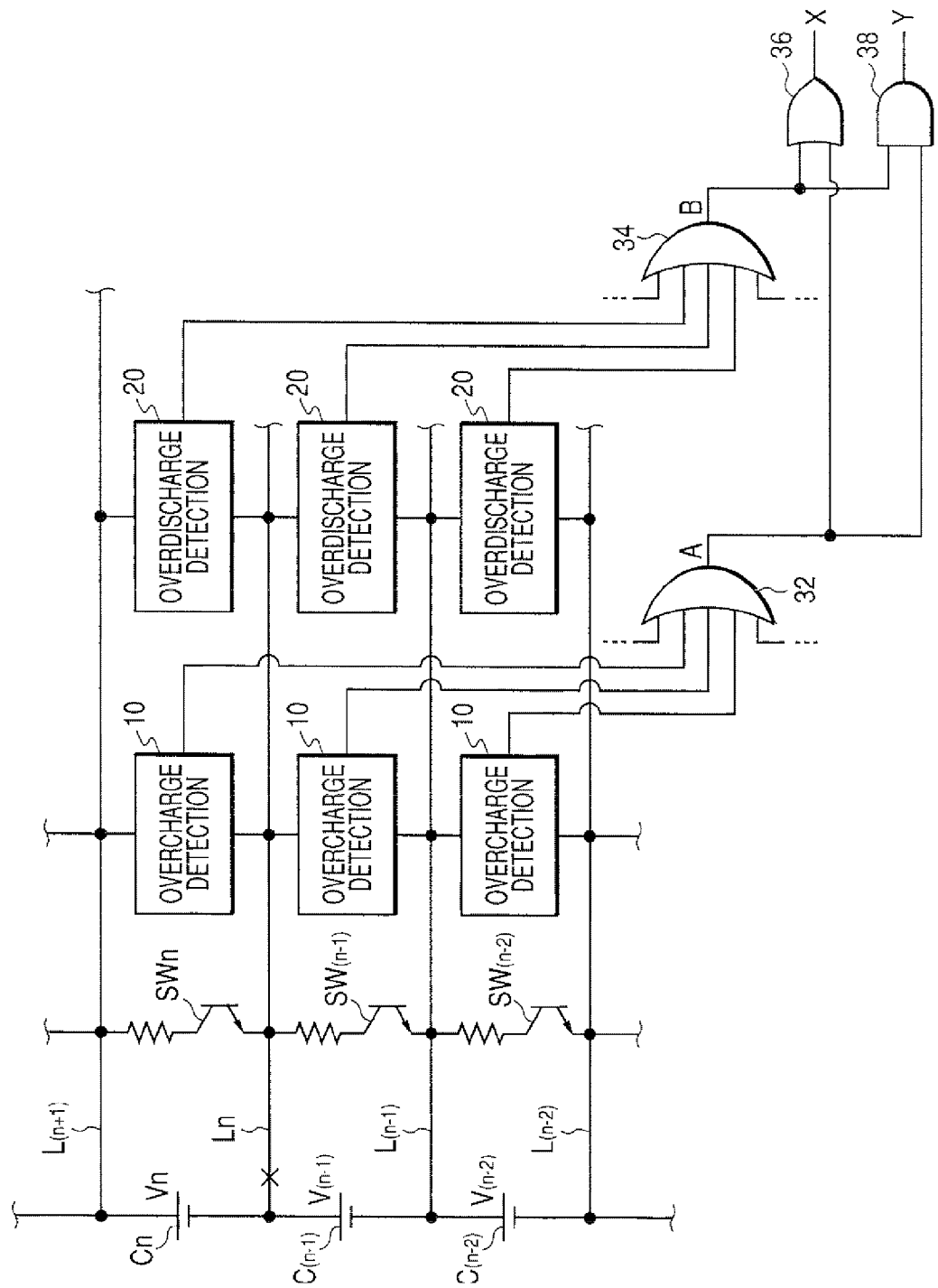
FIG. 4 is a diagram showing a circuit structure of a part of the control device for detecting a line breakage included in the abnormality detection apparatus shown in FIG. 1.

FIG. 4 is a diagram showing a circuit structure of a part of the control device 30, which is for taking in the outputs of the overcharge detecting circuits 10 and the overdischarge detecting circuits 20. As shown in FIG. 4, this part of the control device 30 includes an OR circuit 32 producing a logical sum A of the outputs of the overcharge detecting circuits 10, and an OR circuit 34 producing a logical sum B of the outputs of the overdischarge detecting circuits 20. This part of the control device 30 further includes an OR circuit 36 producing a logical sum X of the logical sum A and the logical sum B, and an AND circuit 38 producing a logical product Y of the logical sum A and the logical sum B. The logical sums A, B and X, and the logical product Y are signals for detecting an overcharge or overdischarge condition of the battery cell Cn, and also detecting breakage of the detection lines L2 to L8. Breakage of the connection lines L2 to L8 mainly occurs not in the connectors C, but in the harnesses on the side of the battery pack Ba.

Figure 5:
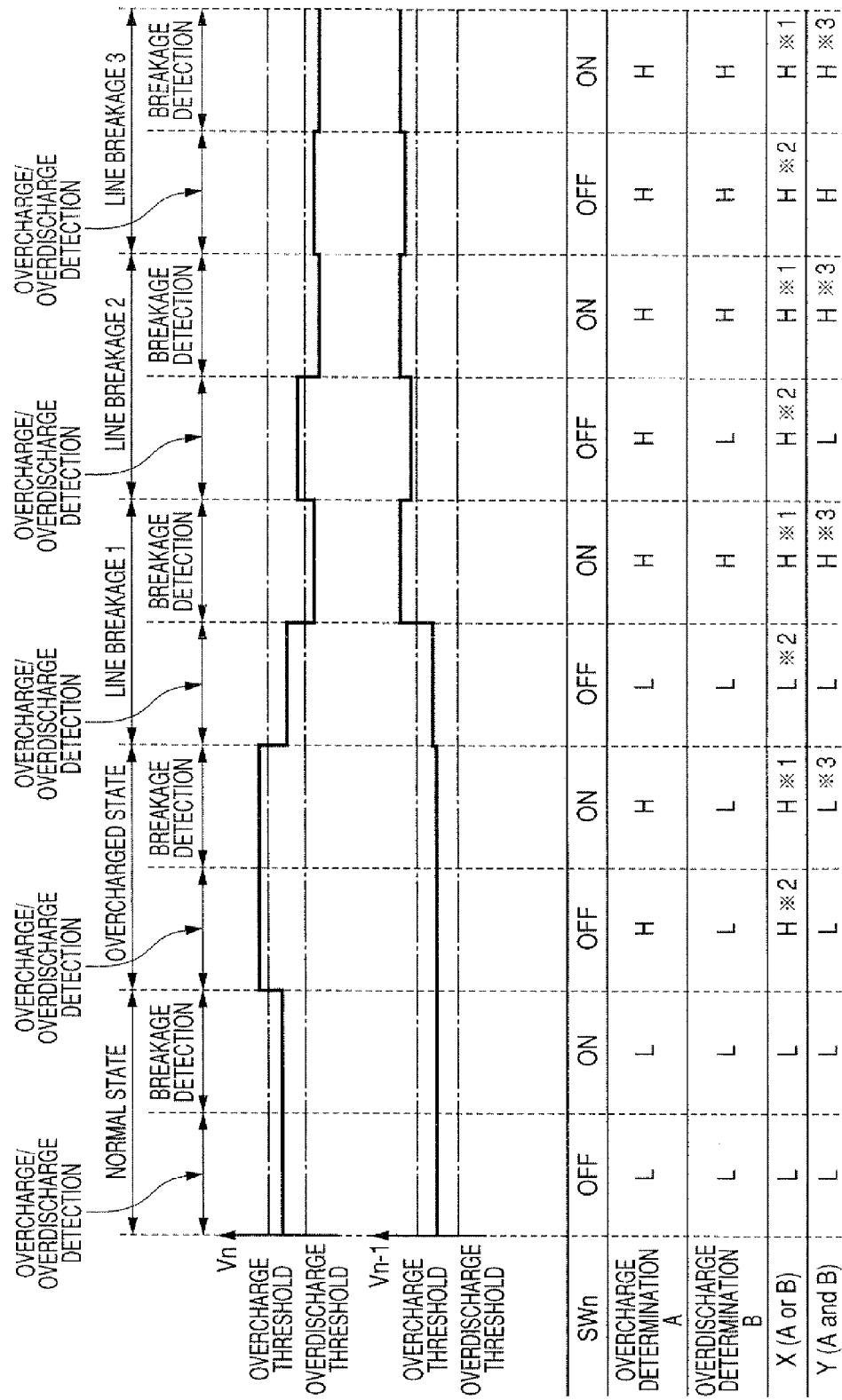
FIG. 5 is a diagram for explaining a principle of abnormality detection in the first embodiment of the invention.

FIG. 5 is a diagram for explaining a principle of the abnormality detection by the abnormality detection apparatus. Since only the difference which appears in this diagram when overcharge occurs and when overdischarge occurs is logical levels (L or H) of the logical sum A and the logical sum B, FIG. 5 shows only the cases when overcharge occurs and when breakage of the detection line occurs, and the case when overdischarge occurs is omitted from FIG. 5.

In a normal state, since the voltage across the battery cell Cn and the voltage across battery cell C(n−1) are between the overcharge threshold VthH and the overdischarge threshold VthL, the voltage between the detection line L(n+1) and the detection line Ln and the voltage between the detection line L(n) and the detection line L(n−1) are also between the overcharge threshold VthH and the overdischarge threshold VthL. Accordingly, when all the switching elements SW1 to SW8 are set in the off state to detect overcharge or overdischarge, the logical sum A and the logical sum B are both at logical "L". Also, when one of the switching elements SW1 to SW8 (the switching element SWn in this explanation) is turned on to detect breakage of the detection line (may be referred to as "line breakage" hereinafter), the voltage Vn between the detection line L(n+1) and the detection line Ln, and the voltage V(n−1) between the detection line L(n) and the detection line L(n−1) remain unchanged from those before the switching element SWn is turned on, because there is no line breakage, and accordingly, the logical sum A and the logical sum B remain logical "L".

On the other hand, if the battery cell Cn is in an overcharged state, since the voltage across the battery cell Cn exceeds the overcharge threshold VthH, when all the switching elements SW1 to SW8 are turned off to detect overcharge or overdischarge, the logical sum A is at logical "H", and the logical sum B is at logical "L". When line breakage detection is performed in this state by turning on one of the switching elements SW1 to SW8 (the switching element SWn in this explanation), the voltage Vn between the detection line L(n+1) and the detection line Ln and the voltage V(n−1) between the detection line L (n) and the detection line L (n−1) remain unchanged from those before the switching element SWn is turned on, because there is no line breakage, and accordingly, the logical sum A remains at logical "H" and the logical sum B remains logical "L".

In FIG. 5, "LINE BREAKAGE 1", "LINE BREAKAGE 2" and "LINE BREAKAGE 3" show cases where the detection line Ln is broken. Differences among "LINE BREAKAGE 1", "LINE BREAKAGE 2" and "LINE BREAKAGE 3" result from variation in impedance in the detection line Ln or the circuits connected to the detection line Ln. For example, when there is substantial variation in impedance among the comparators 12 of the overcharge detecting circuits 10 or the comparators 20 of the overdischarge detecting circuits 20, substantial variation may occur in the impedance between the detection line Ln and the detection line L (n+1), and the impedance between the detection line Ln and the detection line L(n−1). In this case, when the detection line Ln is broken, each of the voltage between the detection line L(n+1) and the detection line Ln, and the voltage between the detection line L(n) and the detection line L(n−1) has a value depending on the impedance thereof.

The "LINE BREAKAGE 1" shows a case where the difference between the above two impedances (the impedance between the line Ln and the detection line L(n+1) and the impedance between the detection line L(n) and the detection line L(n−1)) is relatively small. In this case, during an overcharge or overdischarge detection, the voltage of the detection line Ln is at about a midpoint between the voltage of the detection line L(n+1) and the voltage of the detection line L(n−1). Accordingly, if the voltages across the battery cells Cn and C(n−1) are normal, the voltage Vn between the detection line L(n+1) and the detection line Ln, and the voltage V(n−1) between the detection line L(n) and the detection line L(n−1) are between the overcharge threshold VthH and the overdischarge threshold VthL, and the logical sums A and B are both at logical "L". In this case, when the switching element SWn is turned on, since the voltage of the detection line Ln is brought up to the voltage of the detection line L(n+1), the voltage Vn between the detection line L(n+1) and the detection line Ln falls below the overdischarge threshold VthL, while on the other hand, the voltage V(n−1) between the detection line L(n) and the detection line L(n−1) exceeds the overcharge threshold VthH. Accordingly, the logical sum X and the logical product Y both become logical "H".

The "LINE BREAKAGE 2" shows a case where the impedance between the detection line L(n) and the detection line L(n−1) is somewhat larger than that between the line Ln and the detection line L(n+1). In this case, during an overcharge or overdischarge detection, the voltage of the detection line Ln shifts to a higher side from a midpoint between the voltage of the detection line L(n+1) and the voltage of the detection line L(n−1). Accordingly, since the voltage V(n−1) between the detection line L(n) and the detection line L(n−1) exceeds the overcharge threshold VthH even if the voltages across the battery cells Cn and C(n−1) are normal, the logical sum A is at logical "H", while the logical sum B is at logical "L". In this case, when the switching element SWn is turned on, since the voltage of the detection line Ln is brought up to the voltage of the detection line L(n+1), the voltage Vn between the detection line L(n+1) and the detection line Ln falls below the overdischarge threshold VthL, while on the other hand, the voltage V(n−1) between the detection line L(n) and the detection line L(n−1) exceeds the overcharge threshold VthH. Accordingly, the logical sum X and the logical product Y both become logical "H". The voltage Vn during the overcharge or overdischarge detection may fall below the overdischarge threshold VthL depending on the voltages across the battery cells Cn and C(n−1). In this case, the logical sum A is at logical "L", and the logical sum B is at logical "H" during the overcharge or overdischarge detection.

The "LINE BREAKAGE 3" shows a case where the impedance between the detection line L(n) and the detection line L(n−1) is larger than that between the line Ln and the detection line L(n+1). In this case, during the overcharge or overdischarge detection, the voltage of the detection line Ln shifts to a higher side from a midpoint between the voltage of the detection line L(n+1) and the voltage of the detection line L(n−1). Accordingly, the voltage V(n) between the detection line L(n+1) and the detection line L(n) falls below the overdischarge threshold VthL, and the voltage V(n−1) between the detection line L(n) and the detection line L(n−1) exceeds the overcharge threshold VthH, even if the voltages across the battery cells Cn and C(n−1) are normal. As a result, the logical sum A and the logical sum Y are both at logical "H". In this case, when the switching element SWn is turned on, since the voltage of the detection line Ln is brought up to the voltage of the detection line L(n+1), the voltage Vn between the detection line L(n+1) and the detection line Ln falls below the overdischarge threshold VthL, while on the other hand, the voltage V(n−1) between the detection line L(n) and the detection line L(n−1) exceeds the overcharge threshold VthH. As a result, the logical sum X and the logical product Y both become logical "H".

As understood from the above, it is possible to distinguish between an overcharge or overdischarge condition of the battery cells and a breakage of the detection lines by utilizing the fact that turning on the switching element SWn causes the logical product Y to become logical "H".

Figure 6:
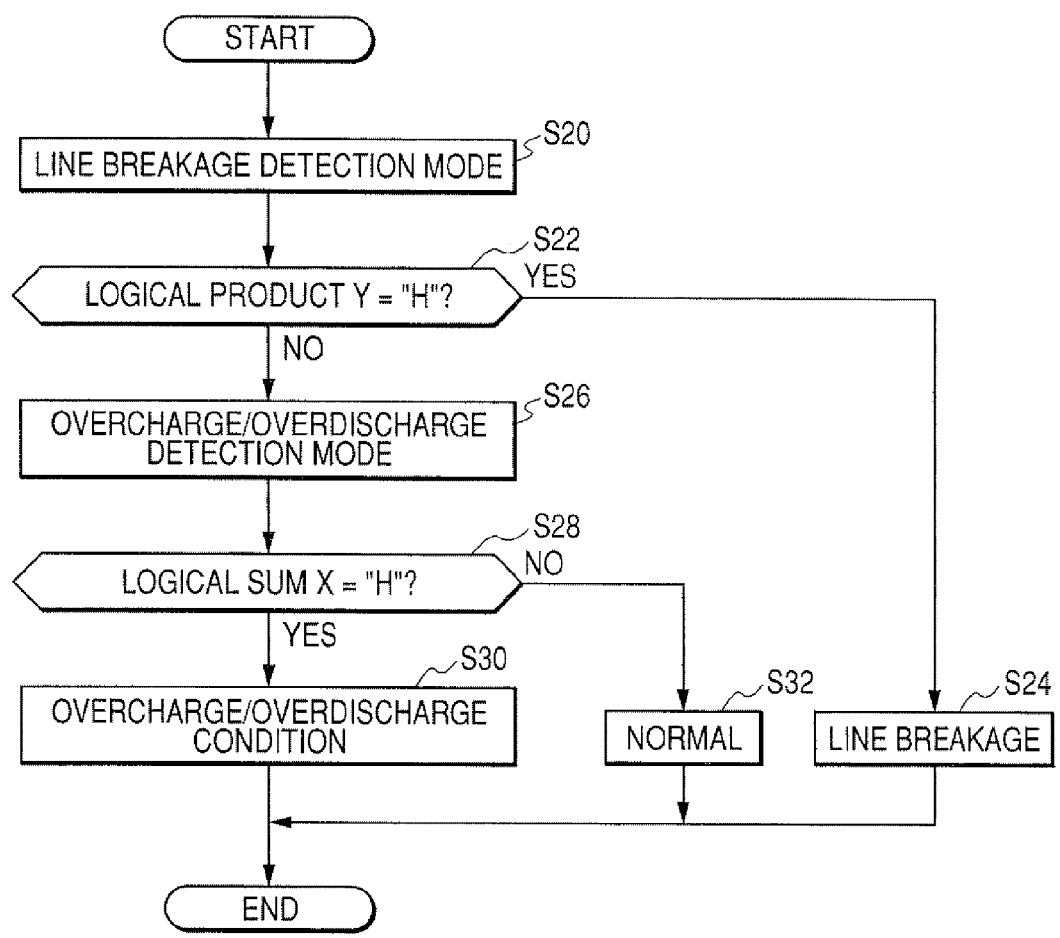
FIG. 6 is a flowchart showing a process of line breakage detection and overcharge/overdischarge detection in the first embodiment of the invention.

FIG. 6 is a flowchart showing a process of the breakage detection and the overcharge or overdischarge detection using the above described principle. This process is repeatedly performed at regular time intervals by the control device 30.

The process begins by setting the abnormality detection apparatus to a breakage detection mode to detect breakage of the detection lines by turning the switching elements SW1 to SW8 successively. In more detail, every other of the switching elements, for example, the switching elements SW1, SW3, SW5 and SW7 may be selected to be turned on at the same time. Instead, one of every three of the switching elements, for example, the switching elements SW1, SW4 and SW7 may be selected to be turned on at the same time. Instead, only one of the switching elements may be selected to be turned on. In short, any selection pattern may by used if adjacent two of the switching elements are not selected to be turned on at the same time.

At subsequent step S22, it is determined whether or not the logical product Y is at logical "H". Step S22 is performed for determining presence of breakage of the detection lines L2 to L8 on the basis of the relationship shown in FIG. 5. If the determination result at step S22 is affirmative, it is determined that a line breakage is present at step S24.

On the other hand, if the determination result at step S22 is negative, the process proceeds to step S26 where the abnormality detection apparatus is set to an overcharge/overdischarge detection mode by turning off all the switching elements SW1 to SW8. Subsequently, it is determined whether or not the logical sum X is at logical "H" level at step S28. Step S28 is performed for determining presence of an overcharge or an overdischarge condition on the basis of the relationship shown in FIG. 5. If the determination result at step S26 is affirmative, it is determined that an overcharge or an overdischarge condition is present at step S30. That is, if there is no line breakage, and the logical sum X is at logical "H", it is determined that an overcharge or an overdischarge condition is present on the basis of the relationship shown in FIG. 5. On the other hand, if the logical sum X is at logical "L", it is determined that there is no abnormality at step S32.

When steps S24, S30 and S32 are completed, the process is terminated.

According to this process, it is possible to reliably determine presence of a line breakage, while distinguishing between a line breakage and an overcharge/overdischarge condition. Incidentally, in a case where the battery cells C1 to C8 include one which is overcharged and one which is overdischarged at the same time, it is not possible to distinguish between a line breakage and an overcharge/overdischarge condition, because this case is the same as the "LINE BREAKAGE 3" shown in FIG. 5. However, the likelihood that such a case will occur is exceedingly small for the following reason.

As described in the foregoing, when the start permission switch is off, the equalized discharge process is performed in order to reduce variation of the voltages across the battery cells C1 to C8. Since no charging process of the battery cells C1 to C8 are performed when the start permission switch is off, the causes of variation of the voltages across the battery cells C1 to C8 are limited to their dark currents (discharge current through the resistors shown in FIG. 3) and self-discharges. Accordingly, when the start permission switch is off, although there is a possibility of occurrence of an overdischarge condition, the likelihood of occurrence of an overcharge condition can be assumed to be substantially zero. On the other hand, when the start permission switch is on allowing the battery cells to be charged, although there is a possibility of occurrence of an overcharge condition, the likelihood of occurrence of an overdischarge condition can be assumed to be substantially zero. Also, under the condition that the battery cells SW1 to SW8 are discharged, although there is a possibility of occurrence of an overcharge abnormality, the probability of occurrence of an overdischarge abnormality can be assumed to be substantially zero. Hence, the possibility that an overcharge condition and an overdischarge condition are both present is negligible.

The first embodiment described above provides the following advantages.

(1) It is determined that a line breakage is present if both the overcharge detecting circuit 10 and the overdischarge detecting circuit 20 detects an abnormality when the switching element SWn is turned on. This makes it possible to distinguish between a line breakage and an overcharge/overdischarge condition, to thereby reliably determining presence of a line breakage.

(2) Presence of an overcharge or overdischarge condition is determined on the basis of a detection result of at least one of the overcharge detecting circuit 10 and the overdischarge detecting circuit 20 on condition that a line breakage is not determined to be present. This makes it possible to reliably determine presence of an overcharge or overdischarge condition.

(3) The equalized discharge process is performed to reduce variation of the voltages across the battery cells C1 to C8. This makes the probability that an overcharge condition and an overdischarge condition occur at the same time as small as negligible. As a result, it becomes possible to reliably determine presence of a line breakage on the basis of the logical product Y.

Second Embodiment

Next, a second embodiment of the invention is described with emphasis on the difference with the first embodiment.

Figure 7:
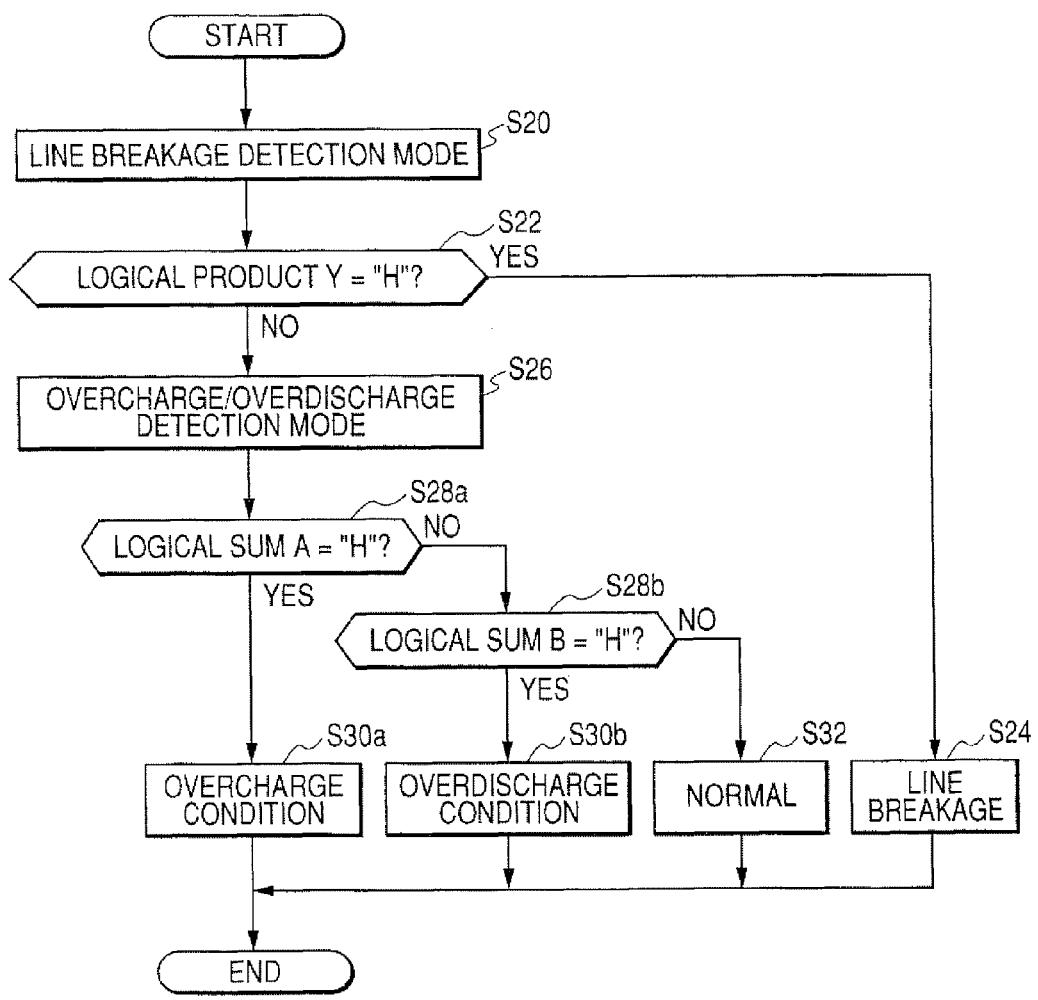
FIG. 7 is a flowchart showing a process of detecting a line breakage and an overcharge/overdischarge condition performed by an abnormality detection apparatus according to a second embodiment of the invention.

FIG. 7 is a flowchart showing a process of detecting a line breakage and an overcharge/overdischarge condition. This process is repeatedly performed at regular time intervals by the control device 30. In FIG. 7, steps which are the same as or correspond to those shown in the previously described FIG. 6 are given the same step numbers.

In this process, after completion of step S26, it is determined whether or not the logical sum A is at logical "H" at step S28a. Step S28a is for determining presence of an overcharge condition. If the determination result at step S28a is affirmative, it is determined that an overcharge condition is present at step S30a. If the determination result at step S28a is negative, it is determined whether or not the logical sum B is at logical "H" at step S28b. Step S28b is for determining presence of an overdischarge condition. If the determination result at step S28b is affirmative, it is determined that an overdischarge condition is present at step S30b.

According to the second embodiment, it is also possible to distinguish between an overcharge condition and an overdischarge condition.

Third Embodiment

Next, a third embodiment of the invention is described with emphasis on the difference with the first embodiment.

Figure 8A:
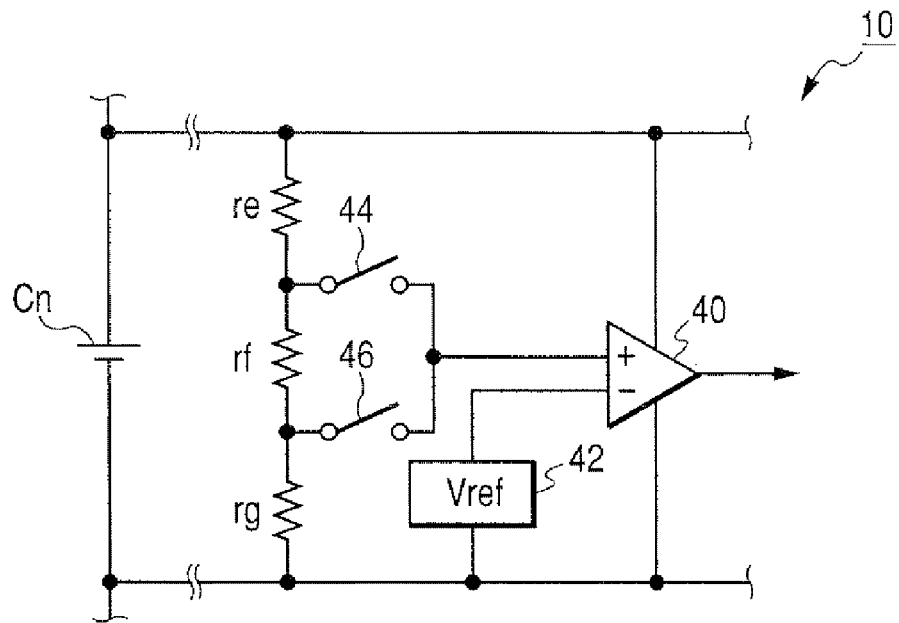
FIG. 8A is a diagram showing a circuit structure of an overcharge detecting circuit included in an abnormality detection apparatus according to a third embodiment of the invention.
Figure 8B:
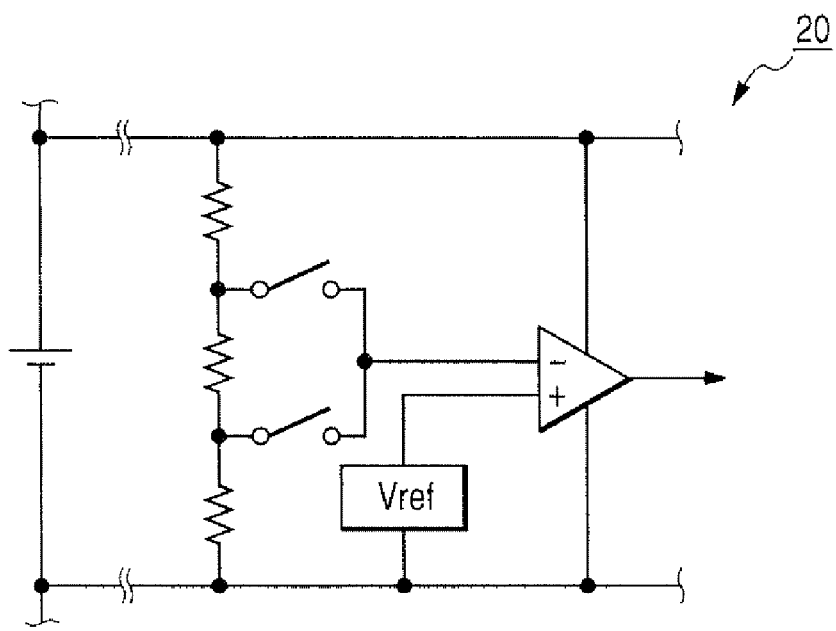
FIG. 8B is a diagram showing a circuit structure of an overdischarge detecting circuit included in the abnormality detection apparatus according to the third embodiment of the invention.

FIG. 8A is a diagram showing a circuit structure of the overcharge detecting circuit 10 of this embodiment, and FIG. 8B is a diagram showing a circuit structure of the overdischarge detecting circuit 20 of this embodiment. In the following, the structure and operation of the overcharge detecting circuit 10 are described. Since the structure and operation of the overdischarge detecting circuit 20 are similar to those of the overcharge detecting circuit 10, they are omitted from being explained.

In this embodiment, the voltage applied to the non-inverting input terminal of a comparator 40 of the overcharge detecting circuit 10 (the divided voltage across the battery cell Cn) can be adjusted in two stages. Accordingly, in this embodiment, a series connection of resistors re, rf and rg is parallel-connected to the battery cell Cn. A connection node between the resistor re and the resistor rf is connected to the non-inverting input terminal of the comparator 40 through a switching element 44. Likewise, a connection node between the resistor rf and the resistor rg is connected to the non-inverting input terminal of the comparator 40 through a switching element 46.

The above structure makes it possible to switch the threshold voltage between $Vref \cdot (re+rf+rg)/(rf+rg)$ and $Vref \cdot (re+rf+rg)/rg$ by selecting one of the switching elements 44 and 46 to be turned on. A similar explanation also applies to the overdischarge detecting circuit 20 shown in FIG. 8B.

According to this embodiment, not only a line breakage of the detection lines L2 to L8 but also poor continuity of the detection lines L2 to L8 can be detected, as explained below. When a line breakage is not present, but poor conductivity is present, although the voltage to be detected is between the overcharge threshold VthH and the overdischarge threshold VthL, it may shift towards the side of either one of the overcharge threshold VthH and the overdischarge threshold VthL due to poor conductivity. In order to detect even such an abnormality, this embodiment is so configured as to switch the threshold between when detecting an overcharge/overdischarge condition and when detecting a line breakage in each of the overcharge detecting circuit 10 and the overdischarge detecting circuit 20. It is preferable that the threshold is switched to a smaller value when detecting a line breakage for the overcharge detecting circuit 10, and the threshold is switched to a larger value when detecting a line breakage for the overdischarge detection circuit 20. Poor conduction to be detected may be caused by resistance increase in the connector portion, for example.

The third embodiment described above provides the following advantage in addition to the advantages (1) to (3) provided by the first embodiment.

(4) In each of the overcharge detecting circuit 10 and the overdischarge detecting circuit 20, the threshold is switched between when detecting an overcharge/overdischarge condition, and when detecting a line breakage. This makes it possible to detect a line breakage more reliably.

Fourth Embodiment

Next, a fourth embodiment of the invention is described with emphasis on the difference with the first embodiment.

Figure 9:
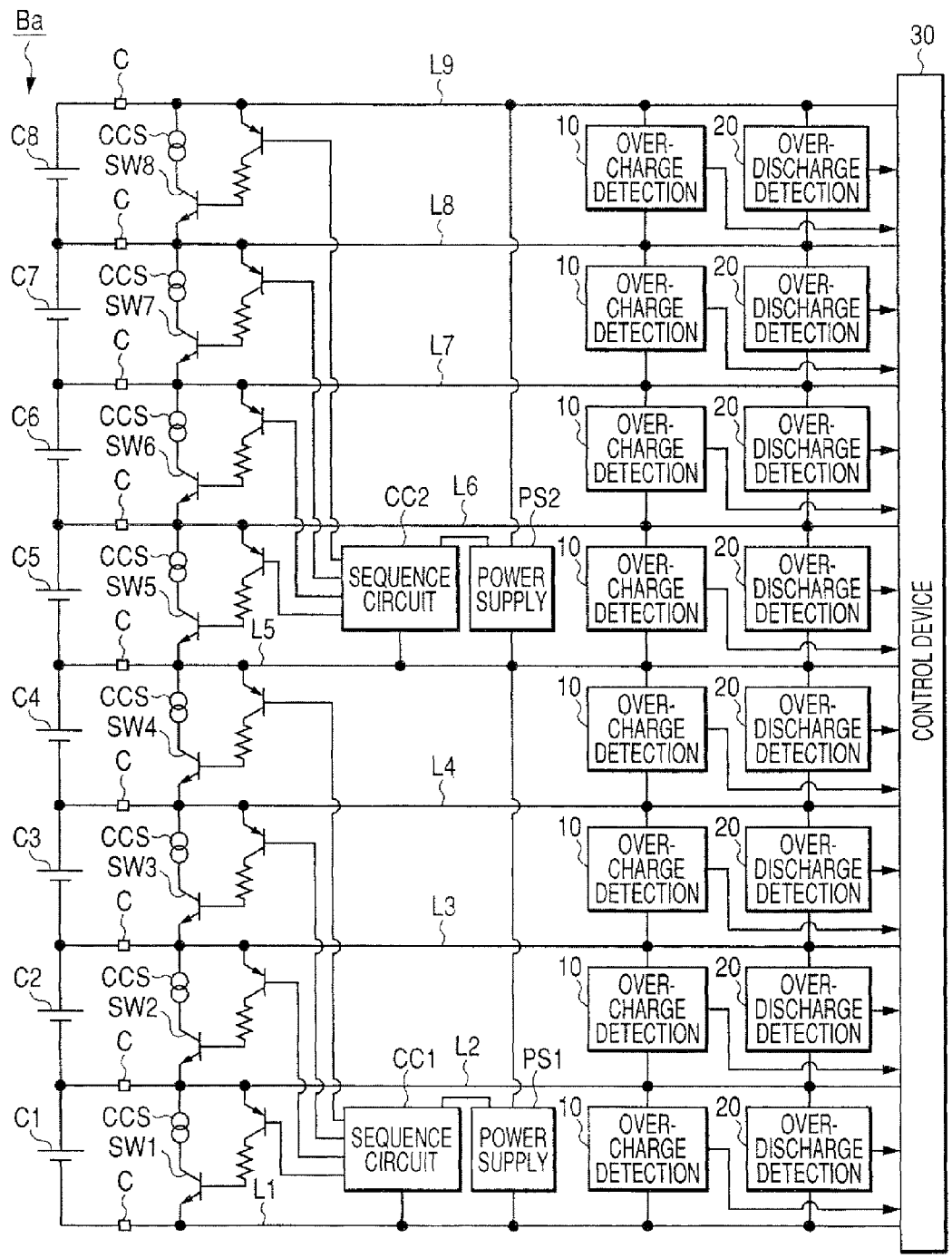
FIG. 9 is a diagram showing a system structure of an abnormality detection apparatus for a battery pack according to a fourth embodiment of the invention.

FIG. 9 is a diagram showing a system structure of an abnormality detection apparatus for a battery pack according to a fourth embodiment of the invention. As shown in FIG. 9, in this embodiment, a series connection of a constant current source CCS and the switching element SWn is parallel-connected to the battery cell Cn as means for short-circuiting the battery cell Cn. This provision is for satisfying both of reduction of electric power consumption when detecting a line breakage as much as possible, and prevention of circuit scale increase. In the structure shown in FIG. 1, to reduce electric power consumption when detecting a line breakage, it is necessary to increase the resistance of the resistor Rn. However, increasing the resistance of the resistor Rn causes the resistor Rn to increase in size. Unlike the first embodiment, according to this embodiment, the means for short-circuiting the battery cell Cn can be made compact in size, because it is constituted by a series connection of the constant current source CCS and the switching element SWn.

The fourth embodiment described above provides the following advantage in addition to the advantages (1) to (3) provided by the first embodiment.

(5) The short-circuit means is constituted by a series connection of the constant current source CCS and the switching element SWn. This makes it possible to reduce electric power consumption when detecting a line breakage without increasing the circuit scale of the short-circuit means.

Fifth Embodiment

Next, a fifth embodiment of the invention is described with emphasis on the difference with the first embodiment.

In the first embodiment, the line breakage detection for the 10 detection line Ln is performed on the basis of the voltage of the detection line Ln, and the voltages of the detection lines L(n+1) and the detection line L(n−1) respectively adjoining to the detection line Ln on the opposite sides. Accordingly, the line breakage detection cannot be performed for the two end-side detection lines L1 and L9. The fifth embodiment is capable of performing the line breakage detection also for the two end-side detection lines L1 and L9, as explained below.

Figure 10B:
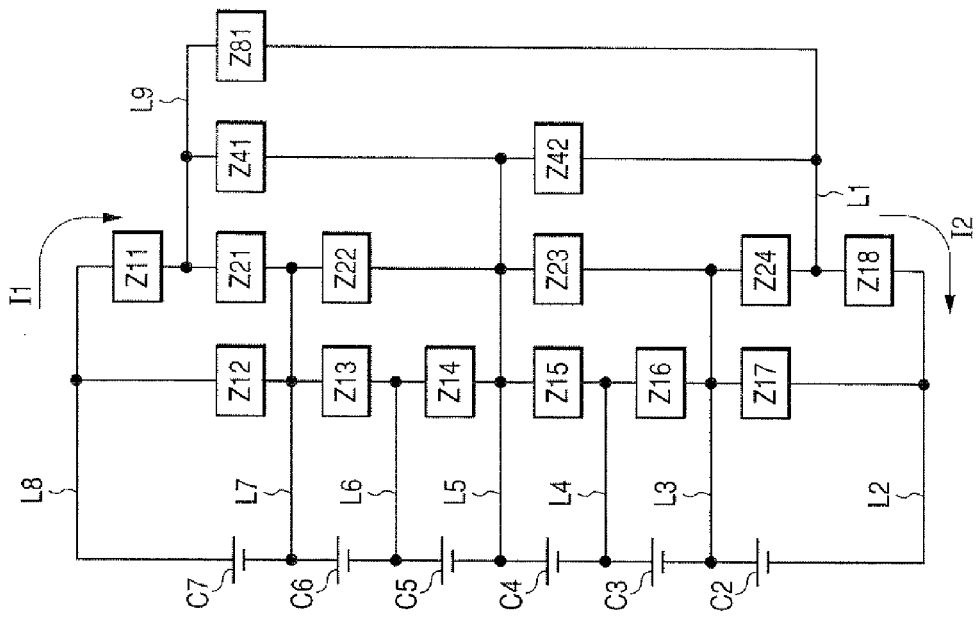
FIGS. 10A and 10B are diagrams showing an equivalent impedance circuit of a system structure of an abnormality detection apparatus according to a fifth embodiment of the invention.
Figure 10A:
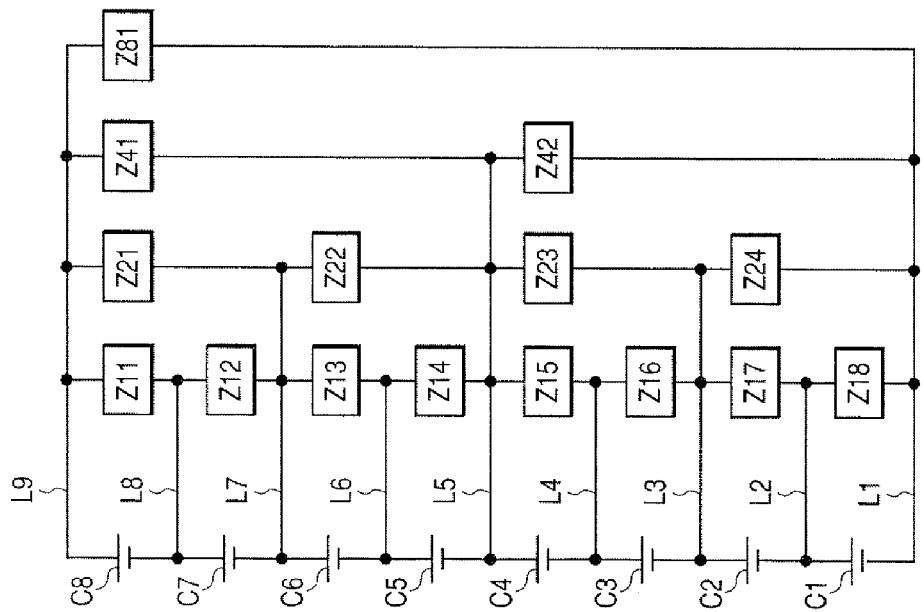

FIG. 10A is a diagram showing an equivalent impedance circuit of an abnormality detection apparatus for a battery pack according to the fifth embodiment of the invention. In this figure, Z11-Z18, Z21-Z24, Z41, Z42, and Z81 denote impedance elements in the system. The impedance elements Z11-Z18 are resistors included in the overcharge detecting circuit 10 or the overdischarge detecting circuit 20. The impedance elements Z41 and Z42 are impedance elements included in the power supply PS1 or PS2 shown in FIG. 1. The impedance elements Z21-Z24 and Z81 are impedance elements included in the circuit for performing the equalized discharge process. For example, the impedance element Z81 is equivalent to the impedance element of the voltage dividing means shown in FIG. 1 of Japanese Patent Application Laid-open No. 2000-83327, and the impedance element Z21-Z23 are equivalent to the resistors 55H, 55L, and the diodes 56H, 56L shown in FIG. 10 of this Patent Document.

In the above structure, as shown in FIG. 10, if the detection line L1 breaks, since a current I2 flows through some of these impedance elements, the voltage of the detection line L1 becomes higher than the voltage of the detection line L2. Likewise, if the detection line L9 breaks, since a current I1 flows through some of these impedance elements, the voltage of the detection line L9 becomes lower than the voltage of the detection line L8. In view of such phenomena, this embodiment detects presence of a line breakage of the detection line L1 on the basis of presence of polarity inversion between the detection line L1 and the detection line L2, and detects presence of a line breakage of the detection line L9 on the basis of presence of polarity inversion between the detection line L8 and the detection line L9.

Figure 11:
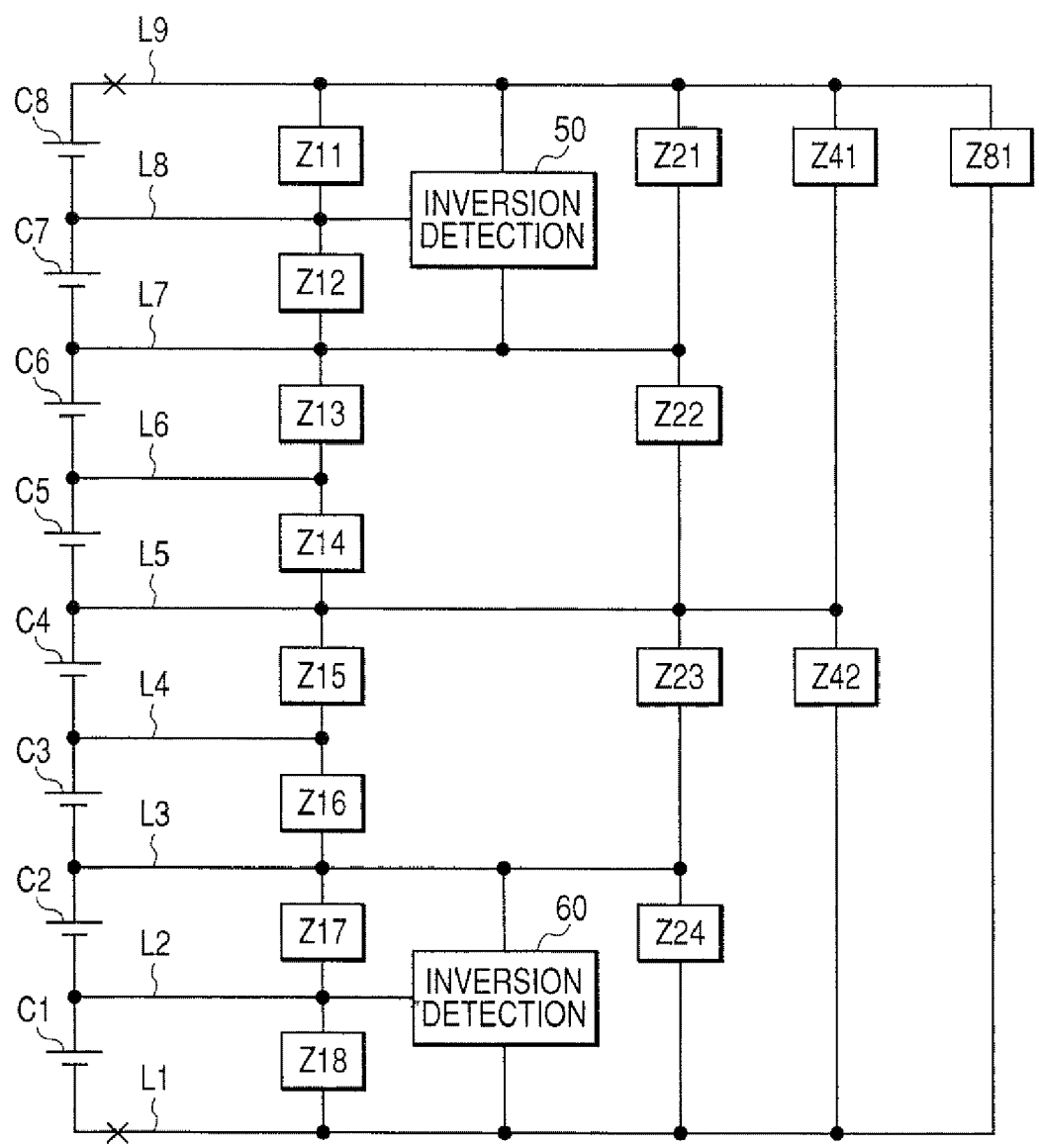
FIG. 11 is a diagram explaining a principle of abnormality detection in the fifth embodiment of the invention.

In more detail, as shown in FIG. 11, presence of a line breakage of the detection line L9 is determined on the basis of presence of polarity inversion between the detection line L8 and the detection line L9 by use of a polarity inversion detecting circuit 50 connected to the detection lines L7 to L9. Likewise, presence of a line breakage of the detection line L1 is determined on the basis of presence of polarity inversion between the detection line L1 and the detection line L2 by use of a polarity inversion detecting circuit 60 connected to the detection lines L1 to L3.

Figure 12A:
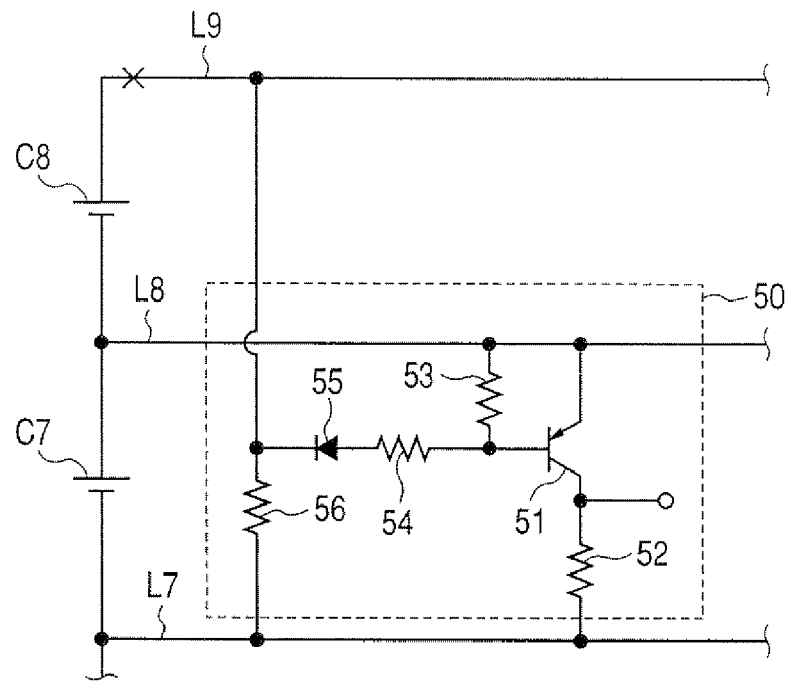
FIGS. 12A and 12B are diagrams showing a circuit structure of a polarity inversion detecting circuit included in the abnormality detection apparatus according to the fifth embodiment of the invention.

FIG. 12A is a diagram showing a circuit structure of the polarity inversion detecting circuit 50. As shown in this figure, the polarity inversion detecting circuit 50 includes a bipolar transistor 51 connected to the detection line L8 at its emitter. The collector of the transistor 51 is connected to the detection line L7 through a resistor 52. The base of the transistor 51 is connected to the detection line L8 through a resistor 53. The base of the transistor 51 is also connected to the anode of a backflow preventing diode 55 through a resistor 54. The detection lines L9 and L7 are connected to each other through a resistor 56. The cathode of the diode 55 is connected to the resistor 56 at a side of the detection line L9.

In the above circuit structure, when the detection line L9 is not broken, the voltage of a connection node between the resistor 56 and the diode 55 is higher than the voltage of the detection line L8 less the sum of the emitter-base voltage needed to turn on the transistor 51 and the voltage drop across the diode 55 in an on state. Accordingly, when the detection line L9 is not broken, the transistor 51 is off, and as a result, the output of the polarity inversion detecting circuit 50 is at logical "L". On the other hand, when the detection line L9 is broken, since the voltage of the detection line L9 is lower than the voltage of the detection line L8, the voltage of the connection node between the resistor 56 and the diode 55 is lower than the voltage of the detection line L8 less the sum of the emitter-base voltage needed to turn on the transistor 51 and the voltage drop across the diode 55 when it is on. Accordingly, when the detection line L9 is broken, the transistor 51 is turned on, and as a result, the output of the polarity inversion detecting circuit 50 becomes logical "H". Hence, if the output of the polarity inversion detecting circuit 50 is at logical "H", it can be determined that the detection line L9 is broken.

Figure 12B:
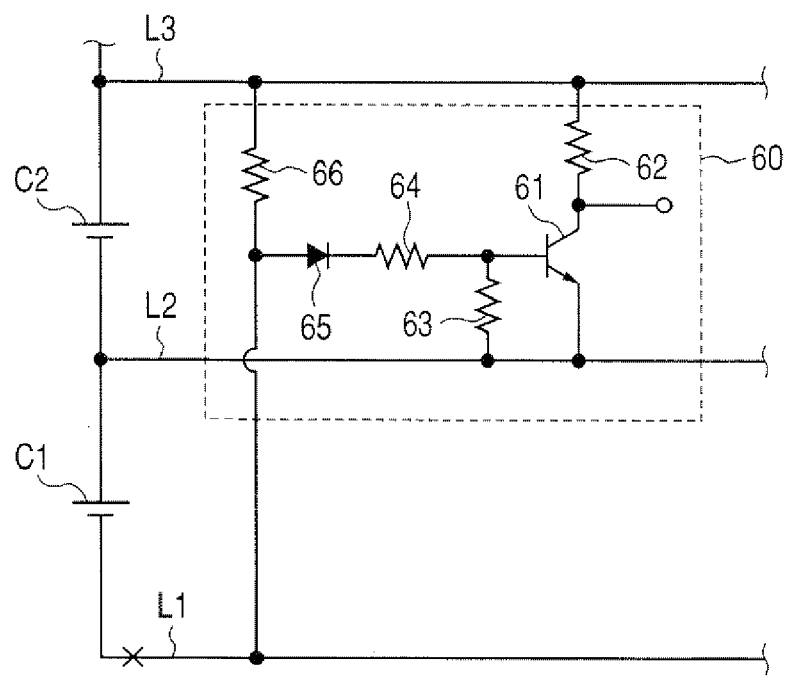

FIG. 12B is a diagram showing a circuit structure of the polarity inversion detecting circuit 60. As shown in this figure, the polarity inversion detecting circuit 60 includes a bipolar transistor 61 connected to the detection line L3 at its emitter through a resistor 62. The emitter of the transistor 61 is connected to the detection line L2. The base of the transistor 61 is connected to the detection line L2 through a resistor 63. The base of the transistor 61 is also connected to the cathode of a backflow preventing diode 65 through a resistor 64. The detection lines L3 and L1 are connected to each other through a resistor 66. The anode of the diode 65 is connected to the resistor 66 at a side of the detection line L1.

In the above circuit structure, when the detection line L1 is not broken, the voltage of a connection node between the resistor 66 and the diode 65 is lower than the voltage of the detection line L2 plus the sum of the emitter-base voltage needed to turn on the transistor 61 and the voltage drop across the diode 65 in an on state. Accordingly, when the detection line L1 is not broken, the transistor 61 is off, and as a result, the output of the polarity inversion detecting circuit 60 is at logical "H". On the other hand, when the detection line L1 is broken, since the voltage of the detection line L1 is higher than the voltage of the detection line L2, the voltage of the connection node between the resistor 66 and the diode 65 is higher than the voltage of the detection line L2 plus the sum of the emitter-base voltage needed to turn on the transistor 61 and the voltage drop across the diode 65 in an on state. Accordingly, when the detection line L1 is broken, the transistor 61 is turned on, and as a result, the output of the polarity inversion detecting circuit 60 becomes logical "L". Hence, if the output of the polarity inversion detecting circuit 60 is at logical "L", it can be determined that the detection line L1 is broken.

The fifth embodiment described above provides the following advantage in addition to the advantages (1) to (3) provided by the first embodiment.

(6) Determination of presence of a line breakage of the end-side detection line L1 (or L9) is made on the basis of presence of polarity inversion between the detection lines L1 and L2 (or detection lines L8 and L9). Accordingly, a line breakage of each of the two end-side detection lines of the battery pack can be detected.

(7) Presence of polarity inversion is determined on the basis of the relationship among the voltage of the detection line of interest, the voltage of the detection line adjacent to the detection line of interest, and the voltage of the detection line next adjacent to the detection line of interest. This makes it possible to reliably detect polarity inversion between the detection line of interest and the adjacent detection line.

(8) The polarity inversion detecting circuit includes the bipolar transistor applied with the voltage corresponding to the voltage of the detection line of interest at its base, applied with the voltage corresponding to the voltage of the detection line adjacent to the detection line of interest at its emitter, and applied with the voltage corresponding to the voltage of the detection line next adjacent to the detection line of interest at its collector. This makes it possible to simplify the structure of the polarity inversion detecting circuit.

Sixth Embodiment

Next, a sixth embodiment of the invention is described with emphasis on the difference with the fifth embodiment.

Figure 13:
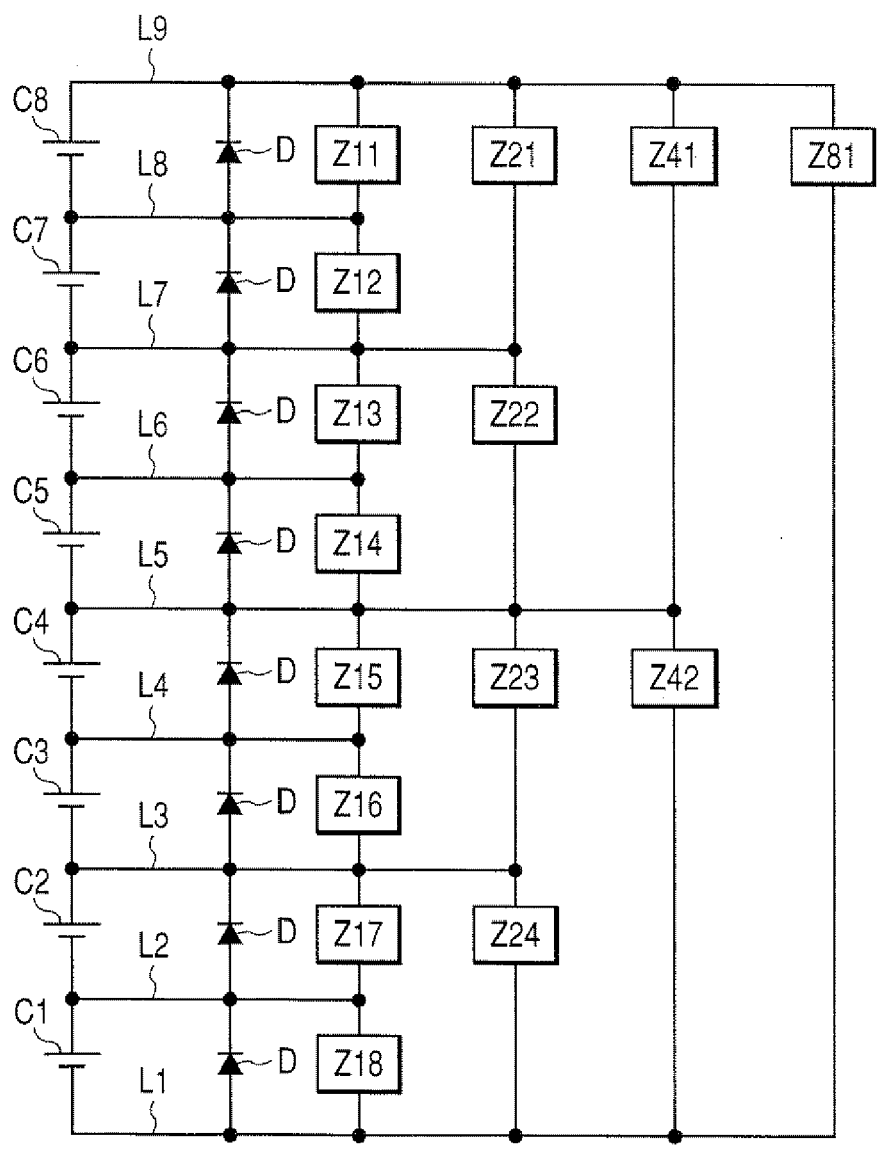
FIG. 13 is diagram showing a modification of the fifth embodiment of the invention, which is provided with a function of electrostatic protection.

In the fifth embodiment, determination of presence of a line breakage of the detection line L9 is made on the basis of the fact that the voltage of the detection line L9 becomes lower than the voltage of the detection line L8, and determination of presence of a line breakage of the detection line L1 is made on the basis of the fact that the voltage of the detection line L1 becomes higher than the voltage of the detection line L2. Incidentally, generally, an abnormality detection apparatus for a battery pack is provided with a function of electrostatic protection. This function is for preventing the connectors C from being applied with a voltage higher than their withstand voltage due to electrostatic charge built up when the connectors C contact some member during manufacturing of the abnormality detection apparatus. FIG. 13 is a diagram showing an example of the abnormality detection apparatus provided with a function of electrostatic protection. As shown in this figure, a diode D is parallel-connected to each of the battery cells C1 to C8. According to this example, if a voltage of a polarity opposite to that of the voltage across the battery cell Cn is applied between the connectors C, since this voltage can be suppressed to about a voltage drop across the diode D, the components of the abnormality detection apparatus can be protected from electrostatic.

However, in this case, the voltage difference between the detection lines L1 and L2, or L8 and L9 when the detection line L1 or L9 breaks is only about the voltage drop across the diode D. Accordingly, it may be difficult to detect polarity inverse between the detection lines L1 and L2, or L8 and L9 when the detection line L1 or L9 breaks. Hence, this embodiment is provided with means for bringing the voltage difference between the connection node between the diode 55 and the resistor 56 and the detection line L8, or the voltage difference between the connection node between the diode 65 and the resistor 66 and the detection line L2 up to a voltage (reference voltage) enough to turn on the transistor 51 or 61.

Figure 14:
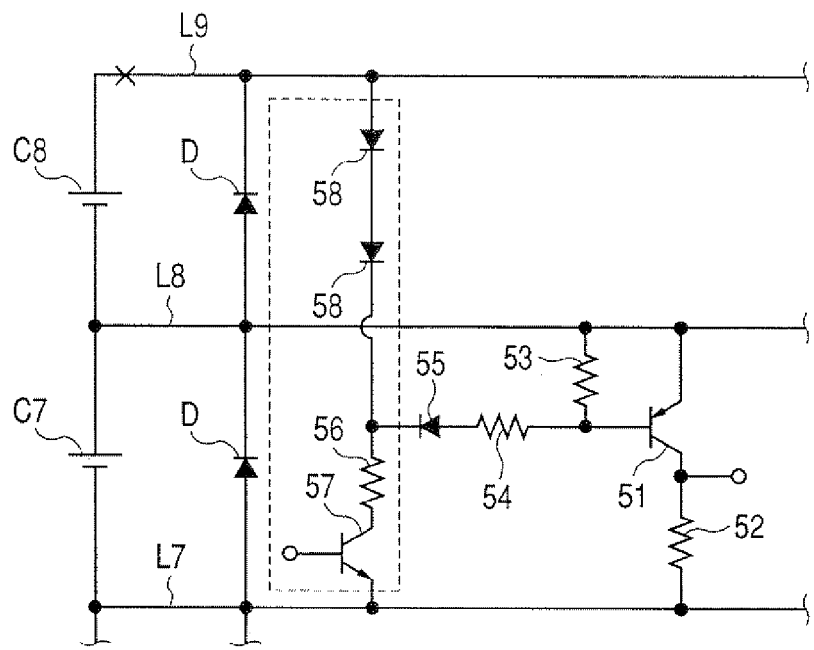
FIG. 14 is a diagram showing a circuit structure of a polarity inversion detecting circuit included in an abnormality detection apparatus according to a sixth embodiment of the invention.

FIG. 14 is a diagram showing a circuit structure of the polarity inversion detecting circuit 50 of this embodiment. In FIG. 14, the reference characters identical to those in FIG. 12A represent the same or corresponding components. As shown in FIG. 14, the polarity inversion detecting circuit 50 includes two diodes 58 series-connected such that their forward directions are from the detection line L9 to the cathode of the diode 55. If the detection line L9 breaks, the voltage of the cathode of the diode 55 becomes lower than the voltage of the detection line L9 by about the sum of the voltage drop across the diode D and twice the voltage drop across the diode 58. This makes it possible to bring the voltage of the cathode of the diode 55 up to such a voltage as to turn on the transistor 51 without fail. The above voltage drop across the diode 58 is set to a value capable of keeping the transistor 51 at an off state as long as the detection line L9 does not break even when the battery cell C8 is overdischarged. This embodiment is further provided with a bipolar transistor 57 as a switching element between the resistor 56 and the detection line L7. The provision of the transistor 57 is for preventing a current from flowing between the resistor 56 and the detection line L7 during a period other than the line breakage detection period.

The polarity inversion detecting circuit 60 in this embodiment also includes two diodes series-connected such that their forward directions are from the anode of the diode 65 to the detection line L1 to provide the same advantage as above.

The sixth embodiment described above provides the following advantages in addition to the advantages provided by the fifth embodiment.

(8) This embodiment is provided with reference voltage generating means for bringing the voltage difference between the input terminal of the polarity inversion detecting circuit and the detection line adjacent to the detection line of interest to the reference voltage to cause polarity inversion when the detection line of interest is broken. This makes it possible for the abnormality detection apparatus provided with the function of electrostatic protection to reliably detect a line breakage of the end-side detection lines.

(9) The reference voltage generating means (a part surrounded by the dotted line in FIG. 14) is constituted including the diodes 58. This makes it possible to generate the reference voltage greater than twice the voltage drop across the diode 58.

(10) The reference voltage generating means is provided with the transistor 57 as a switching element for opening and closing the current path thereof. This makes it possible to prevent electric power from being uselessly consumed during a period other than the line breakage detection period.

Seventh Embodiment

Next, a seventh embodiment of the invention is described with emphasis on the difference with the sixth embodiment.

Figure 15:
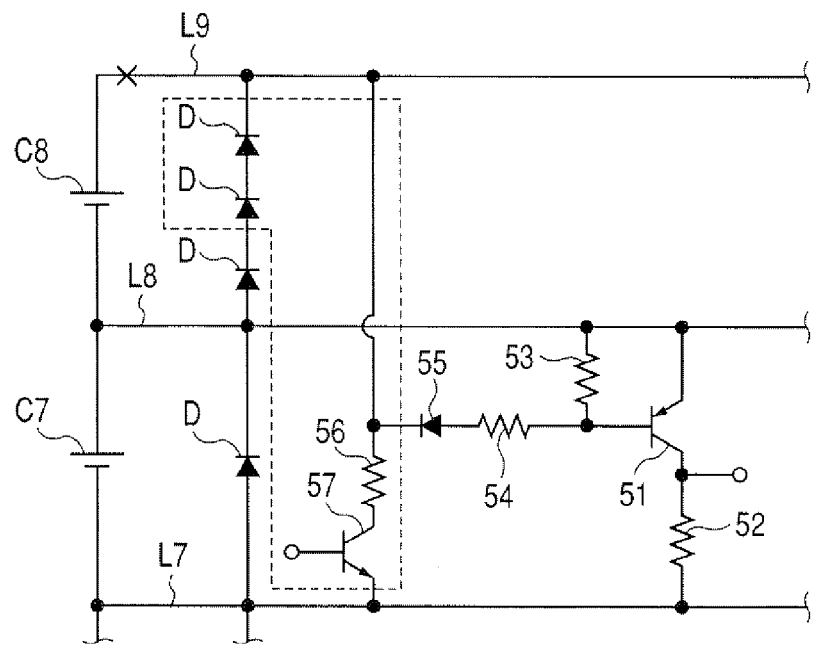
FIG. 15 is a diagram showing a circuit structure of a polarity inversion detecting circuit included in an abnormality detection apparatus according to a seventh embodiment of the invention.

FIG. 15 is a diagram showing a circuit structure of the polarity inversion detecting circuit 50 of this embodiment. In FIG. 15, the reference characters identical to those in FIG. 14 represent the same or corresponding components. As shown in FIG. 15, in this embodiment, three diodes D are series-connected such that their forward directions are from the detection line L8 to the detection line L9. If the detection line L9 breaks, the voltage of the cathode of the diode 55 becomes lower than the voltage of the detection line L8 by about three times the voltage drop across the diode D. This makes it possible to bring the voltage of the cathode of the diode 55 to such a voltage as to turn on the transistor 51 without fail.

The polarity inversion detecting circuit 60 of this embodiment also includes three diodes series-connected such that their forward directions are from the line L1 to the detection line L2 to provide the same advantage as above.

The seventh embodiment described above provides the following advantage in addition to the advantage (7) provided by the sixth embodiment.

(11) The reference voltage generating means is constituted by the three diodes series-connected between the detection lines L1 and L2, or L8 and L9. This makes it possible to generate the reference voltage as large as three times the voltage drop across the diode D.

Eighth Embodiment

Next, an eighth embodiment of the invention is described with emphasis on the difference with the sixth embodiment.

Figure 16A:
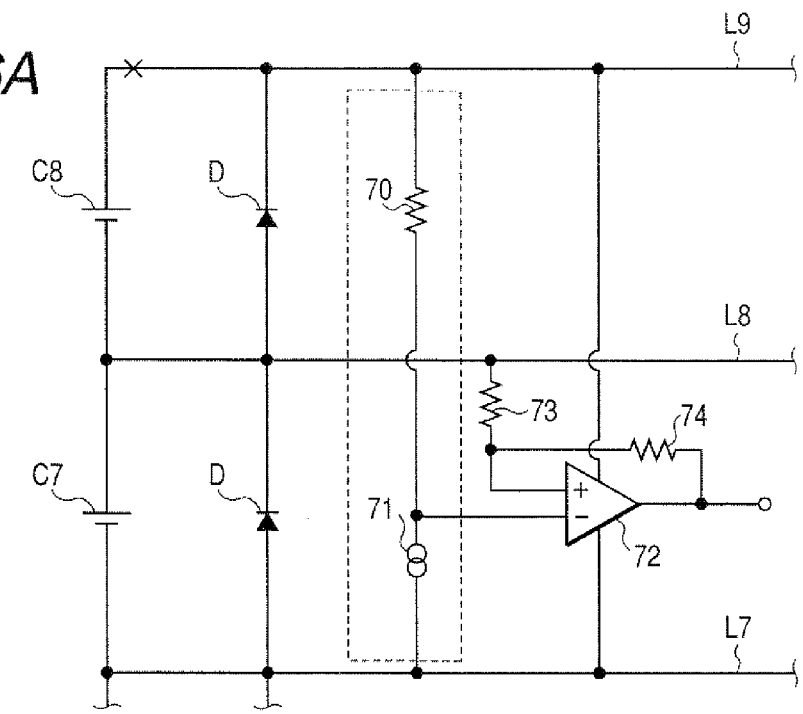
FIGS. 16A and 16B are diagrams showing a circuit structure of a polarity inversion detecting circuit included in an abnormality detection apparatus according to an eighth embodiment of the invention.

FIG. 16A is a diagram showing a circuit structure of the polarity inversion detecting circuit 50 of this embodiment. As shown in this figure, the detection line L9 is connected to the detection line L7 through a resistor 70 and a constant current source 71. The non-inverting input terminal of a comparator 72 powered through the detection lines L9 and L7 is connected with the detection line L8 through a resistor 73, while the inverting input terminal thereof is connected to a connection node between the resistor 70 and the constant current source 71. The output terminal of the comparator 72 is connected to the non-inverting input terminal thereof through a resistor 74. The comparator 72 with the resistor 74 operates as a hysteresis comparator.

According to the above circuit structure, when the detection line L9 is not broken, since the voltage applied to the inverting input terminal of the comparator 72 is higher than the voltage applied to the non-inverting input terminal of the comparator 72 by a certain value, the output of the comparator 72 (the output signal of the polarity inversion detecting circuit 50) is at logical "L". On the other hand, if the detection line L9 breaks, since the voltage applied to the inverting input terminal of the comparator 72 becomes lower than the voltage applied to the non-inverting input terminal of the comparator 72 by a certain value, the output of the comparator 72 becomes logical "H". Hence, when the output of the polarity inversion detecting circuit 50 changes from logical "L" to logical "H", it can be determined that the detection line L9 is broken.

Incidentally, if the voltage between the two input terminals of the comparator 72 is not the same as the voltage between the detection lines L9 and L7 as power supply lines, the comparator 72 cannot properly perform value comparison between these voltages applied to the input terminals thereof. Accordingly, when the voltage of the detection line L9 becomes lower than the voltage of the detection line L8 due to breakage of the detection line L9, a problem may arise depending on the voltage applied to the non-inverting input terminal. In view of this, in this embodiment, the comparator 72 is constituted to operate as a hysteresis comparator, so that the voltage applied to the non-inverting input terminal can be made lower than the voltage of the detection line L9.

Figure 16B:
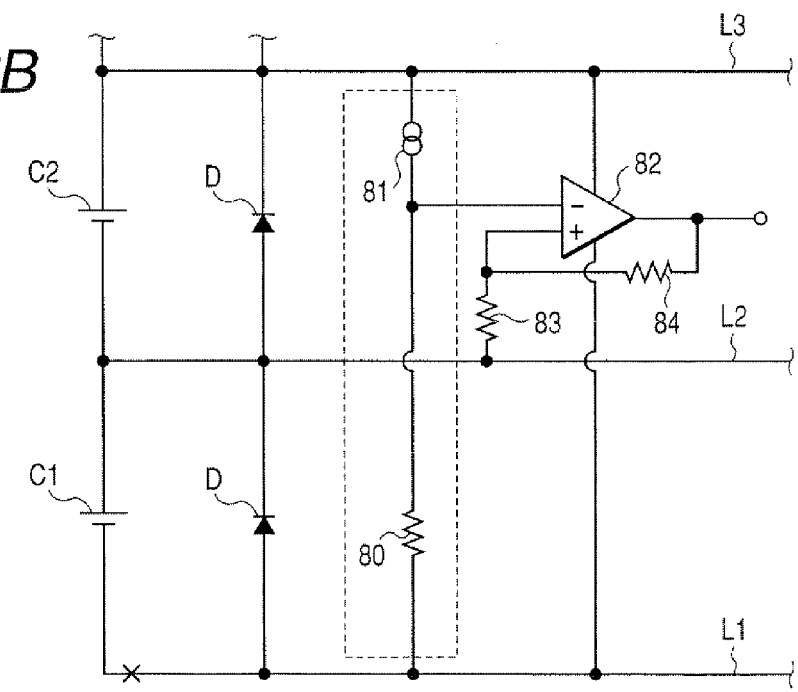

FIG. 16B is a diagram showing a circuit structure of the polarity inversion detecting circuit 60 of this embodiment. As shown in this figure, the detection line L1 is connected to the detection line L3 through a resistor 80 and a constant current source 81. The non-inverting input terminal of a comparator 82 powered through the detection lines L1 and L3 is connected with the detection line L2 through a resistor 83, while the inverting input terminal thereof is connected to a connection node between the resistor 80 and the constant current source 81. The output terminal of the comparator 82 is connected to the non-inverting input terminal thereof through a resistor 84. The comparator 82 with the resistor 84 operates as a hysteresis comparator.

According to the above circuit structure, when the detection line L1 is not broken, since the voltage applied to the inverting input terminal of the comparator 82 is lower than the voltage applied to the non-inverting input terminal of the comparator 82 by a certain value, the output of the comparator 82 (the output signal of the polarity inversion detecting circuit 60) is at logical "H". On the other hand, if the detection line L1 breaks, since the voltage applied to the inverting input terminal of the comparator 82 becomes higher than the voltage applied to the inverting-input terminal of the non-inverting input terminal of the comparator 82 by a certain value, the output of the comparator 82 becomes logical "L". Hence, when the output of the polarity inversion detecting circuit 60 changes from logical "H" to logical "L", it can be determined that the detection line L1 is broken.

The eighth embodiment described above provides the following advantage in addition to the advantages (7) provided by the sixth embodiment.

(12) The reference voltage generating means (a part surrounded by the dotted line in FIG. 16) is constituted by a series of the resistor 70 (or 80) and the constant current source 71 (or 81) connected between the detection line L1 of interest and the detection line L3 (or between the detection line L9 of interest and the detection line L7). This makes it possible to adjust the voltage between the non-inverting input terminal of the polarity inversion detecting circuit constituted by the comparator 72, resistors 73, 74 (or constituted by the comparator 82, resistors 83, 84), and the detect-on line L9 (or detection line L1) when the detection line L9 (or L1) breaks.

(13) The polarity inversion detecting circuit is constituted including the hysteresis comparator comparing the voltage applied to the input terminal thereof (the inverting input terminal of the comparator 72 or 82) with the voltage corresponding to the voltage of the detection line L8 or L2 adjacent to the detection line L9 or L1 of interest. This makes it possible to reliably detect presence of polarity inversion.

Ninth Embodiment

Next, a ninth embodiment of the invention is described with emphasis on the difference with the first embodiment.

As explained in the foregoing, when the line breakage detection is performed on the basis of the logical product Y outputted from the AND circuit 38, if an overcharge condition and an overdischarge condition occur at the same time, there is a possibility to make an erroneous determination that a line breakage is present in the battery cell Cn. It can be assumed that before an overcharge or overdischarge condition occurs, the voltage across the battery cell Cn gradually changes from a normal level to an abnormal level. Accordingly, if it is possible to refer to voltage history of the battery cell Cn before detection of simultaneous occurrence of overcharge and overdischarge conditions, presence of a line breakage can be detected more reliably. In the following, a method of detecting a line breakage in view of this is explained.

Figure 17:
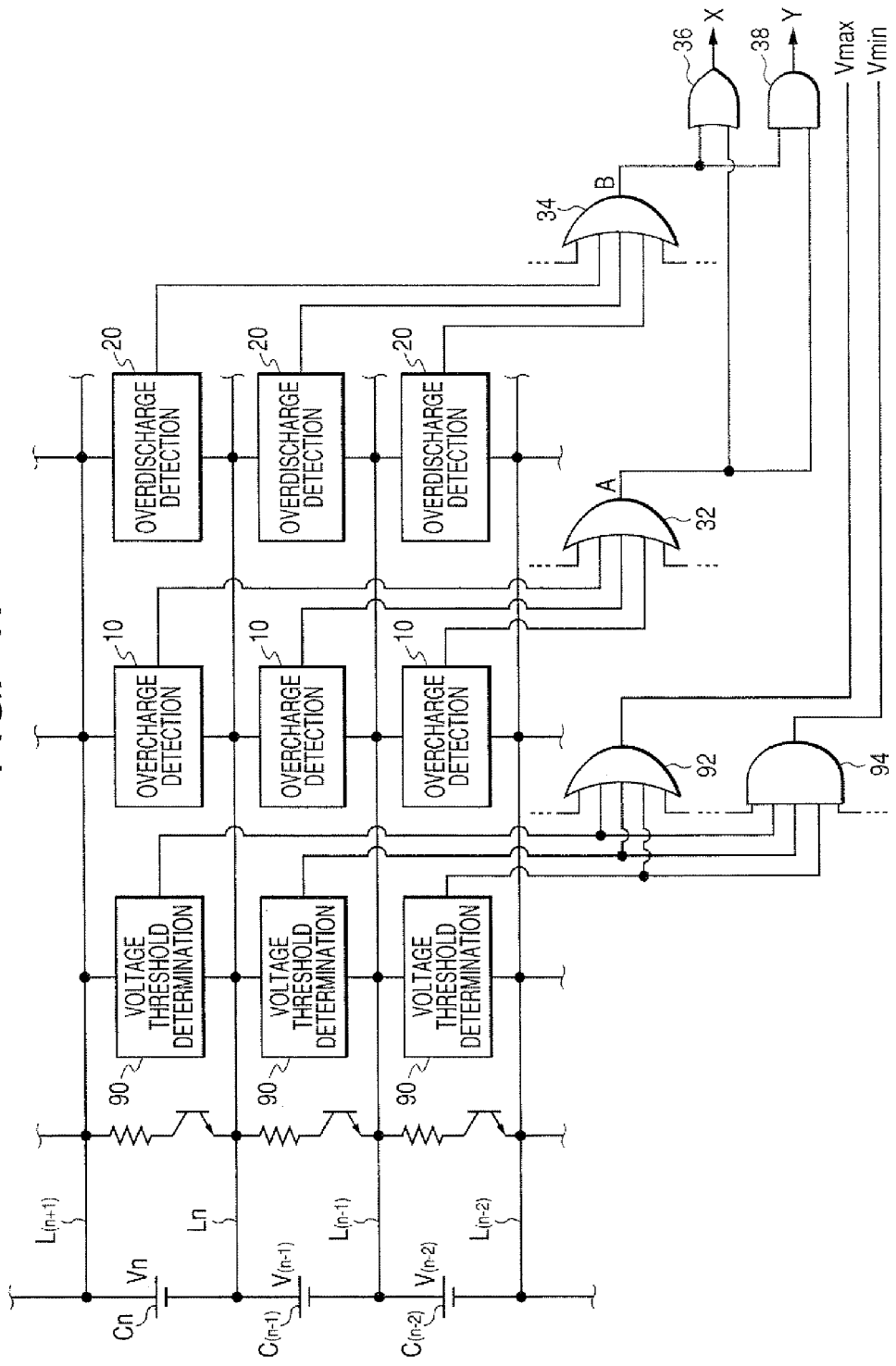
FIG. 17 is a diagram showing a circuit structure of a part of a control device for detecting a line breakage included in an abnormality detection apparatus according to a ninth embodiment of the invention.

FIG. 17 is a diagram showing a part of a system structure of an abnormality detection apparatus for a battery pack according to a ninth embodiment of the invention. In FIG. 17, the reference characters identical to those in FIG. 4 represent the same or corresponding components As shown in this figure, in this embodiment, a voltage threshold determining section 90 is parallel-connected to the battery cell Cn. The voltage threshold determining section 90 is an A/D converter which passes time-series data representing the voltage of the battery cell Cn in digital form to a serial line. The time-series data is formed of a plurality of bits.

Figures 18A, 18B:
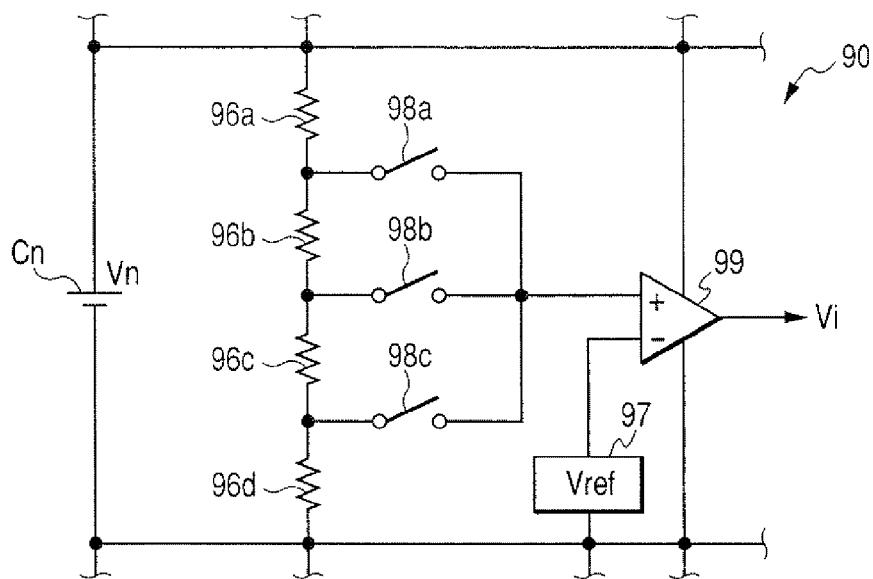
FIG. 18A is a diagram showing a circuit structure of a voltage threshold determining section included in the abnormality detection apparatus according to the ninth embodiment of the invention.
FIG. 18B is a table showing relationships between a voltage across a battery cell and an output of a comparator included in the voltage threshold determining section.

FIG. 18A is a diagram showing a circuit structure of the voltage threshold determining section 90. As shown in this figure, the voltage threshold determining section 90 includes a series connection of a plurality of resistors 96a to 96d parallel-connected to the battery cell Cn. Each of the divided versions of the voltage across the battery cell Cn generated by this series connection is compared with a reference voltage Vref generated by a reference voltage source 97 in a comparator 99. To enable successively selecting one of the voltages at a plurality of the resistors (the divided versions of the voltage across the battery cell Cn), which should be applied to the comparator 99 and compared with the reference voltage, switching elements 98a, 98b, and 98c are provided. By turning on the switching element 98a, the voltage of a connection node between the resistor 96a and the resistor 96b can be applied to the comparator 99. By turning on the switching element 98b, the voltage of a connection node between the resistor 96b and the resistor 96c can be applied to the comparator 99. By turning on the switching element 98c, the voltage of a connection node between the resistor 96c and the resistor 96d can be applied to the comparator 99.

FIG. 18B is a table showing relationships between the voltage Vn across the battery cell Cn and the output Vi of the comparator 99 when either one of the switching elements 98a to 98c is turned on. As shown in this table, by selectively turning on one of the switching elements 98a to 96c, it is virtually possible to output results of comparison between the voltage across the battery cell Cn and three different thresholds. Hence, by turning one of the switching elements 98a to 98c successively in accordance with a predetermined time series pattern, it is possible to output the voltage across the battery cell Cn in the form of 3-bit digital data through the serial line.

As shown in FIG. 17, the output of each of the voltage threshold determining sections 90 is taken in an OR circuit 92 and an AND circuit 94. The OR circuit 92 outputs a logical sum Vmax of the outputs of the voltage threshold determining sections 90 each of which is parallel-connected to a corresponding one of the battery cells. The AND circuit 94 outputs a logical product Vmin of the outputs of the voltage threshold determining sections 90 each of which is parallel-connected to a corresponding one of the battery cells. The difference between the logical sum Vmax and the logical product Vmin when the switching elements 98a to 98c are successively turned on in accordance with the predetermined time series pattern represents variation in voltage of the battery cell Cn in the form of 3-bit digital data. This is explained in detail below with reference to FIG. 19.

FIG. 19 shows, in (a), (b) and (c) thereof, variations with time of switching states of the switching elements 98a, 98b and 98c. FIG. 19 further shows, in (d), (e) and (f) thereof, variations with time of the output (logical sum Vmax) of the OR circuit 92, the output (logical product Vmin) of the AND circuit 94, and the difference with time between the logical sum Vmax and the logical product Vmin (the time-series data). As shown in FIG. 19, the time-series data is represented as 3-bit digital data updated at the switching rate of the switching elements 98a to 98c.

Figure 20:
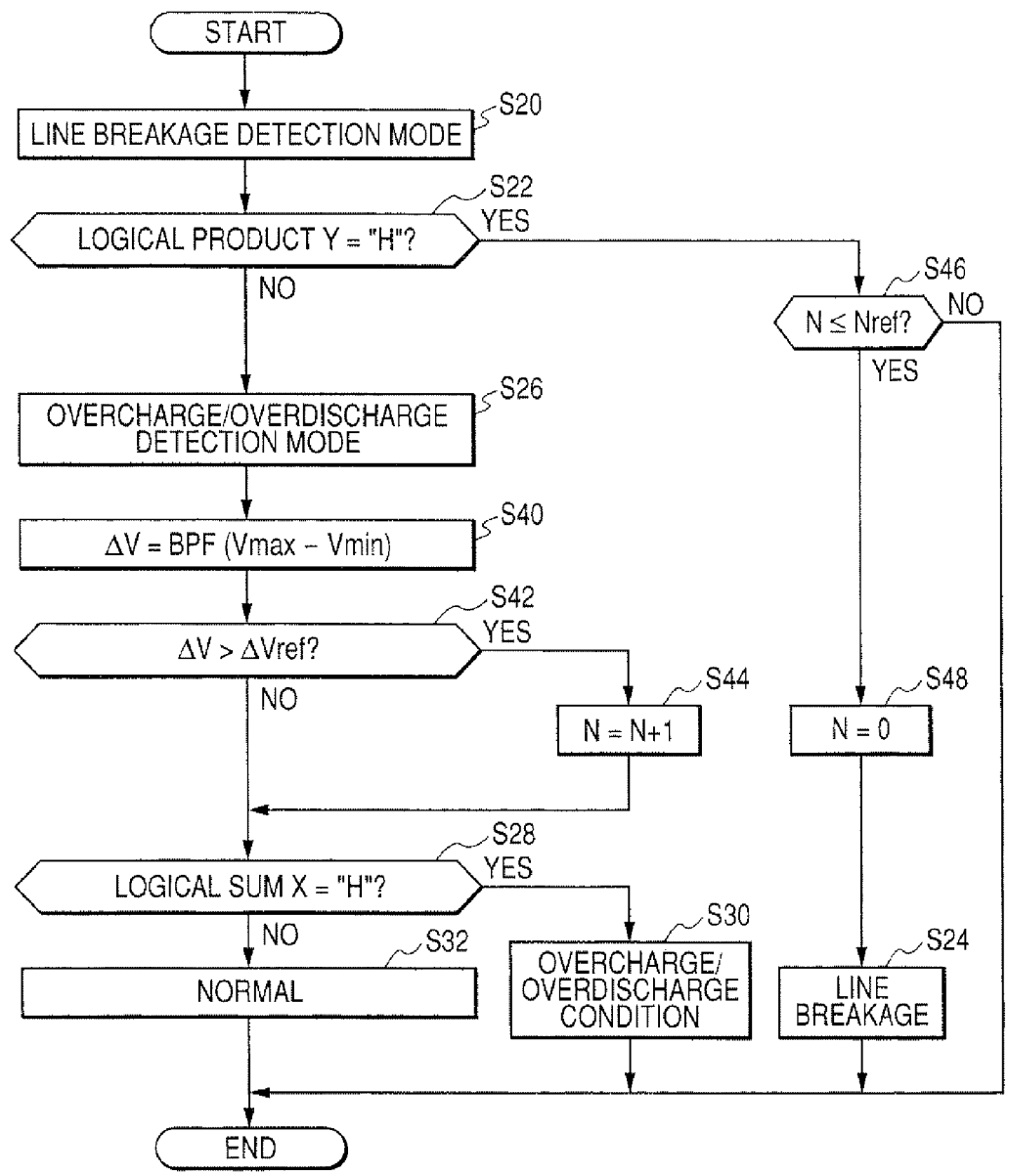
FIG. 20 is a flowchart showing a process of line breakage detection and overcharge/overdischarge detection in the ninth embodiment of the invention.

FIG. 20 is a flowchart showing a process of the detection of a line breakage and the detection of a overcharge/overdischarge condition in this embodiment. This process is repeatedly performed at regular time intervals by the control device 30. In FIG. 20, steps which are the same as or correspond to those shown in the previously described FIG. 6 are given the same step numbers.

Figure 21:
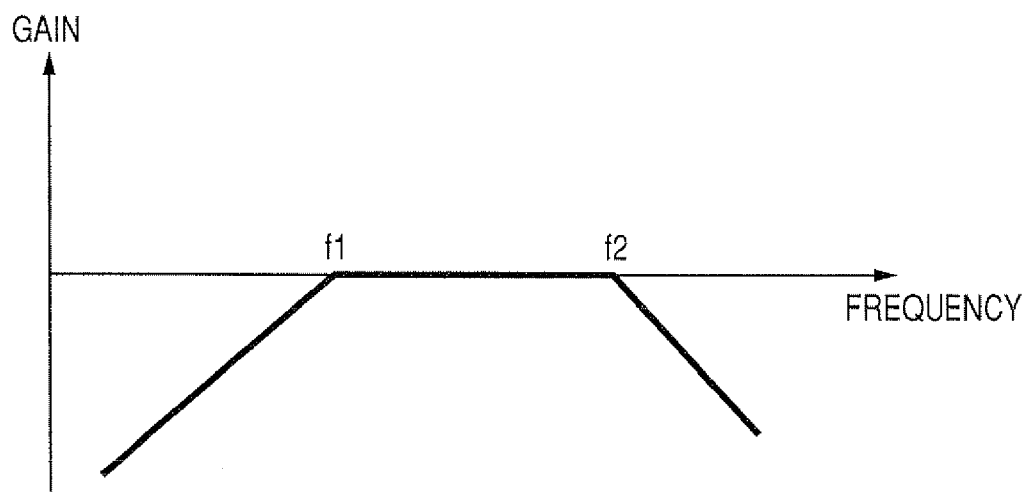
FIG. 21 is a diagram showing a gain characteristic of a band-pass filter used to perform the process shown in FIG. 20.

In this process, when step S26 is completed, the difference between the logical sum Vmax and the logical product Vmin is passed to a band-pass filter to generate a differential signal ΔV. FIG. 21 is a diagram showing a gain characteristic of the band-pass filter. As shown in this figure, the band-pass filter has both a low-pass filtering function and a high-pass filtering function. The cut-off frequency f1 on the lower frequency side, which attains the high-pass filtering function, is to remove the effect of natural variation in voltage among the battery cells. Voltage differences among the battery cells may increase at a very slow rate. The cut-off frequency f1 is set to remove the effect of the increase at a very slow rate from the differential signal ΔV. The cut-off frequency f2 on the higher frequency side, which attains the high-pass filtering function, is to remove the effect of incident noise from the differential signal ΔV.

At subsequent step S42, it is determined whether or not the differential signal ΔV is above a predetermined threshold Vref. Step S42 is for making a determination whether the variation in voltage of the battery cells has become reasonable or not. The threshold ΔVref is set to such a value as to enable determining whether the variation in voltage of the battery cells has become within a range lower than the overcharge threshold and higher than the overdischarge threshold for the battery cells.

If the determination result at step S42 is affirmative, a counter value N is incremented at step S44 in order to measure a period of time during which the differential signal ΔV exceeds the threshold ΔVref. When step S44 is completed, or if the determination result at step S42 is negative, the process proceeds to step S28.

On the other hand, if the determination result at step S22 is affirmative, it is determined at step S46 whether or not the counter value N is equal to or smaller than a predetermined threshold value Nref. Step S46 is for determining whether or not the cause that the logical product Y has become logical "H" is in a line breakage of the detection lines L2 to L8. The threshold value Nref is set taking account of an assignable maximum value of the counter value N at the time when the logical sum Y becomes logical "H" due to a line breakage of the detection lines L2 to L8. This is because, if the voltage variation increases at a rate higher than a certain value before the logical product Y becomes logical "H", an overcharge condition and an overdischarge condition may occur at the same time even if there is no line breakage of the detection lines L2 to L8, which may cause the logical product Y to become logical "H".

If the determination result at step S46 is affirmative, that is, if it is determined that the cause that the logical product Y has become logical "H" is in a line breakage of the detection lines L2 to L8, the process proceeds to step S48 to initialize the counter value N, and then proceeds to step S24.

Figure 22:
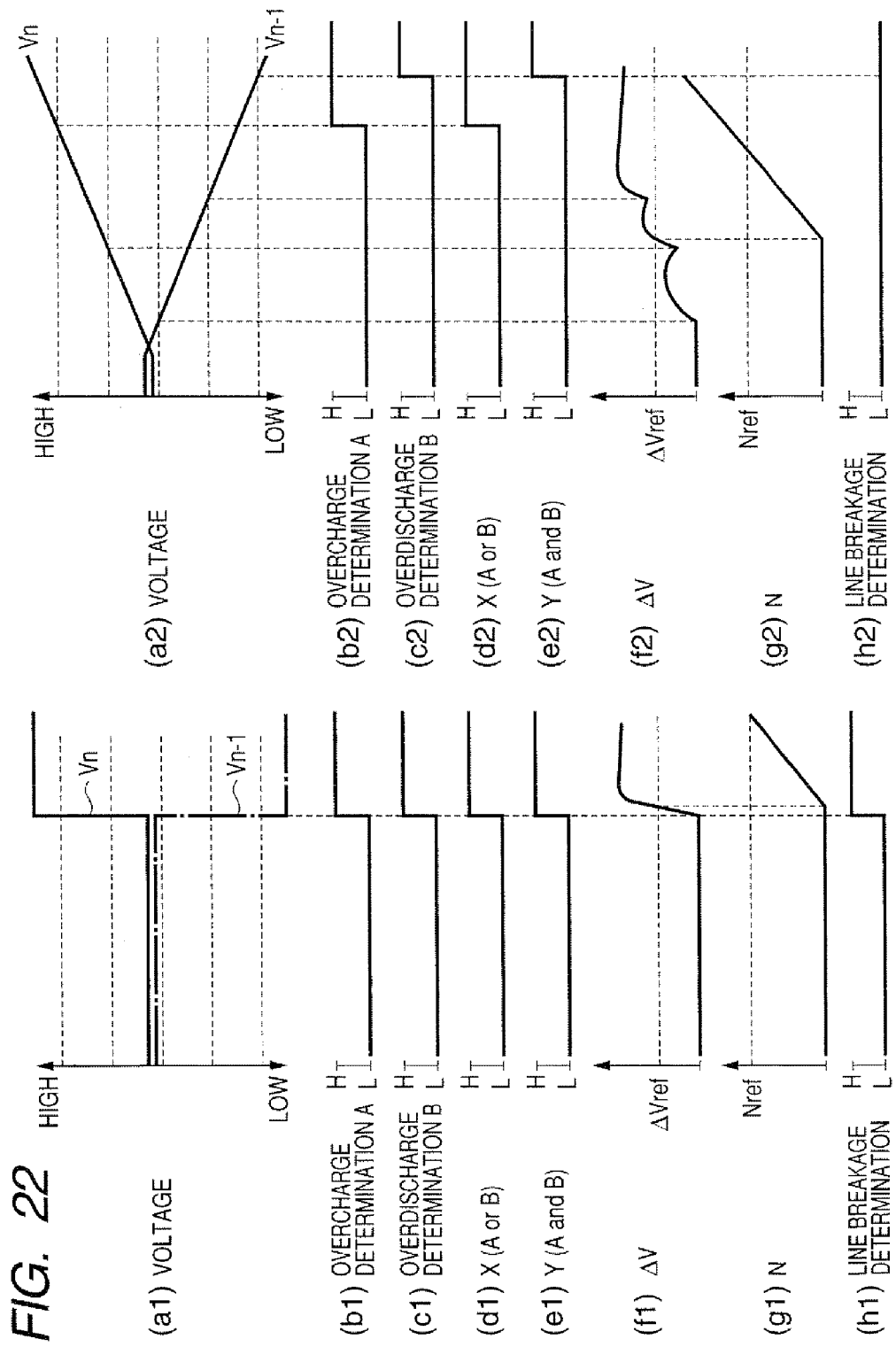
FIG. 22 is a diagram showing examples of detection of a line breakage in the ninth embodiment of the invention.

FIG. 22 is a diagram showing first and second examples of detection of a line breakage in this embodiment. The first example shown by (a1) to (h1) of FIG. 22 is a case where the differential signal ΔV is constant before a line breakage occurs, while on the other hand, the second example shown by (a2) to (h2) of FIG. 22 is a case where the differential signal ΔV increases with time before a line breakage occurs. First, the first example is explained. In FIG. 22, (a1) shows variations with time of the voltages across the battery cells Cn and C(n−1), (b1) shows variation with time of the logical value of the logical sum A used for an overcharge determination, (c1) shows variation with time of the logical value of the logical sum B used for an overdischarge determination, (d1) shows variation with time of the logical value of the logical sum X, and (e1) shows variation with time of the logical value of the logical product Y. FIG. 22 further shows variation with time of the differential signal ΔV in (g1) thereof, and variation with time of the counter value N in (h1) thereof.

As shown in FIG. 22, if a line breakage occurs, the voltage across the battery cell Cn is brought to a level showing an overcharge condition, and the voltage across the battery cell C(n−1) is brought to a level showing an overdischarge condition. Accordingly, the logical sum Y becomes logical "H". On the other hand, since the differential signal ΔV is constant before the line breakage occurs, it does not exceed the threshold value before the logical sum Y becomes logical "H". Accordingly, since the counter value N is not incremented, it does not exceed the threshold value Nref before the logical sum Y becomes logical "H". Hence, it can be determined that the cause that the logical product Y has become logical "H" is not increase of variation in voltage among the battery cells, but a line breakage.

Next, the second example is explained. As shown in FIG. 22, in the second embodiment, as the voltage variation increases, the differential signal ΔV increases. However, since the differential signal ΔV is a signal generated by filtering the difference between the maximum and minimum of the battery cell voltages represented in digital form, if this difference in digital form remains unchanged over a certain time period, the differential signal ΔV turns to decrease after having increased. Accordingly, when the differential signal ΔV exceeds the threshold ΔVref, it can be determined that the voltage variation is increasing at a rate greater than a certain value. Also, when the differential signal ΔV exceeds the threshold ΔVref, the counter value N is incremented. Therefore, when the voltage variation further increases, and the logical product Y becomes logical "H", the counter value N exceeds the threshold value Nref. Hence, it can be determined that the cause that the logical product Y has become logical "H" is the increase of the voltage variation, and not a line breakage.

Incidentally, when the voltage variation in the battery pack increases only at an extremely small rates the differential signal ΔV does not increase. In this case, there is a possibility to make an erroneous determination that the cause that the logical product Y has become logical "H" is a line breakage. However, the likelihood of such a case occurring is negligible, because if the voltage variation increases at an extremely small rate, the equalized discharge process is performed each time the voltage variation reaches a certain level.

The ninth embodiment described above provides the following advantage in addition to the advantages (1) to (3) provided by the first embodiment.

(14) If both the overcharge detecting circuit 10 and the overdischarge detecting circuit 20 detect abnormality at the same time when turning on the switching element SWn, determination of presence of a line breakage is made in view of the voltage history of the battery cell. This makes it possible to reliably determine presence of a line breakage.

(15) It is determined that a line breakage is present if both the overcharge detecting circuit 10 and the overdischarge detecting circuit 20 detect abnormality, only on condition that the voltage variation before making this determination is not substantially in an increase trend. This makes it possible to reliably determine whether the cause that the logical product Y has become logical "H" is a line breakage or the voltage variation. This condition also makes it possible to detect a line breakage even if it occurs after slight increase of the voltage variation.

(16) The differential signal ΔV is generated by high-pass filtering the signal representing the voltage variation (Vmax−Vmin) of the battery cells. This makes it possible to accurately determine whether or not the above condition is satisfied on the basis of the signal representing the voltage variation (Vmax−Vmin).

(17) The differential signal ΔV is generated also by low-pass filtering the signal representing the voltage variation (Vmax−Vmin) of the battery cells. This makes it possible to remove incident noise superimposed on the signal representing the voltage variation (Vmax−Vmin).

Tenth Embodiment

Next, a tenth embodiment of the invention is described with emphasis on the difference with the ninth embodiment.

Figure 23:
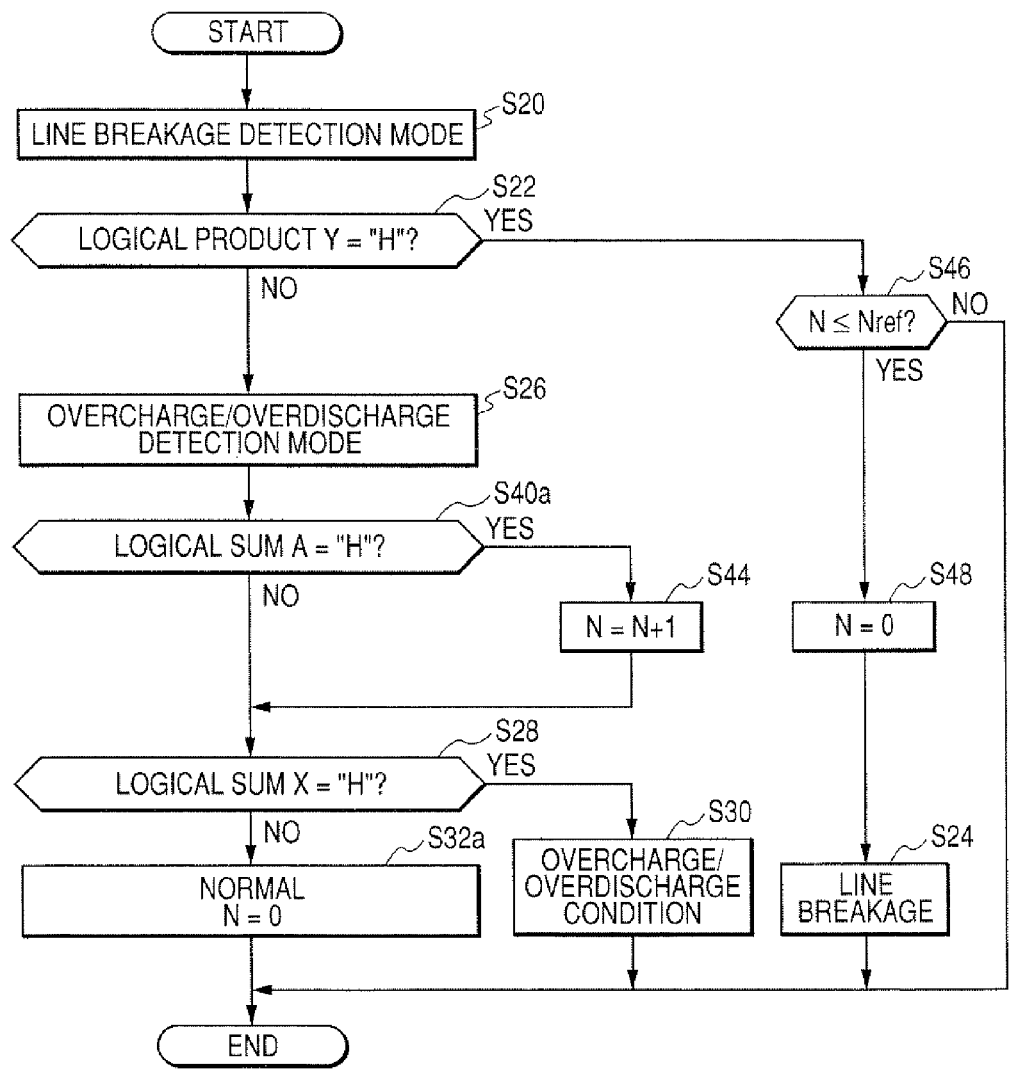
FIG. 23 is a flowchart showing a process of line breakage detection and overcharge/overdischarge detection in an abnormality detection apparatus according to a tenth embodiment of the invention.

This embodiment is not provided with the voltage threshold determining sections 90. Instead, a line breakage and an overcharge/overdischarge condition are detected by performing the process in the flowchart shown in FIG. 23. This process is repeatedly performed at regular time intervals by the control device 30. In FIG. 23, steps which are the same as or correspond to those shown in the previously described FIG. 20 are given the same step numbers.

In this process, after completion of step S26, it is determined whether or not the logical sum A is at logical "H" at step S40a. Step S40a is for determining whether or not the battery cells of the battery pack Ba include one which is overcharged or overdischarged. If the determination result at step S40a is affirmative, the counter value N is incremented at step S44. In this embodiment, the counter value N represents a period of time over which no overcharge/overdischarge condition is detected. When step S44 is completed, or if the determination result at step S40a is negative, the process proceeds to step S28. At step S32a, a normality determination is made, and in addition, the counter value N is initialized.

Figure 24:
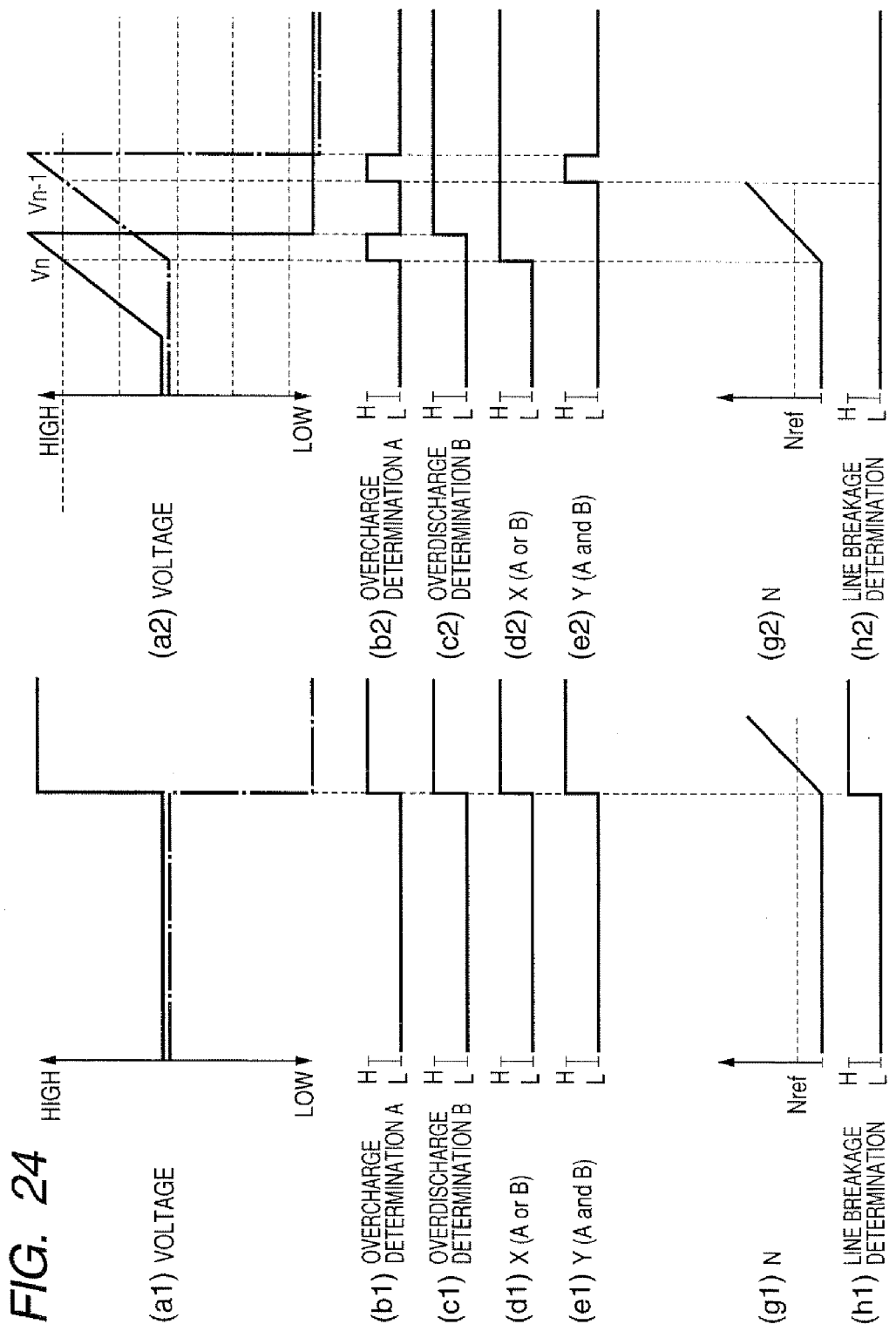
FIG. 24 is a time chart showing examples of detection of a line breakage in the tenth embodiment of the invention.

FIG. 24 is a diagram showing first and second examples of detection of a line breakage in this embodiment. The first example shown by (a1) to (h1) in FIG. 24 is a case where the logical product Y becomes logical "H" due to occurrence of a line breakage with no overcharge/overdischarge condition occurring. The second example shown by (a2) to (h2) in FIG. 24 is a case where the battery cells Cn and C(n−1) are overcharged, and then malfunction, as a result of which they are overdischarged. The brackets (a1) to (e1), (g1) and (h1) of FIG. 24 correspond to the brackets (a1) to (e1), (g1) and (h1) of FIG. 22. The brackets (a2) to (e2), (g2) and (h2) of FIG. 24 correspond to the brackets (a2) to (e2), (g2) and (h2) of FIG. 22. In the first example, since the counter value N does not increase, and no overcharge condition is detected before the logical product Y becomes logical "H", it can be determined that the cause that the logical product Y has become logical "H" is a line breakage.

In the second example, as shown in FIG. 24, if the timing at which an overcharge condition occurs or the battery cell malfunctions is different between the battery cell C and the battery cell C(n−1), there is a period in which both an overcharge condition and an overdischarge condition are present. In this case, the counter value N starts to be incremented when the overcharge condition is detected. Accordingly, since the counter value N exceeds the threshold value Nref when the logical sum Y becomes "H", it can be determined that the cause that the logical product Y has become logical "H" is an overcharge condition. Preferably, the threshold value Nref is set depending on a time period after an elapse of which the overcharged battery cell is supposed to malfunction.

The tenth embodiment described above provides the following advantage in addition to the advantages (1) to (3) provided by the first embodiment, and the advantage (14) provided by the ninth embodiment.

(18) If both the overcharge detecting circuit 10 and the overdischarge detecting circuit 20 detect abnormality at the same time when turning on the switching element SWn, determination of presence of a line breakage is made in view of a previous determination result of the overcharge detecting circuit 10. This makes it possible to prevent erroneously determining that a line breakage is present when the logical product Y becomes logical "H" after the battery cell is overcharged and then malfunctions.

(19) It is determined that a line breakage is present if both the overcharge detecting circuit 10 and the overdischarge detecting circuit 20 detect abnormality when the switching element SWn is turned on, only on condition that the overcharge detecting circuit 10 did not detect any abnormality over a certain time period immediately before this determination. This makes it possible to reliably determine presence of a line breakage.

Other Embodiments

It is a matter of course that various modifications can be made to the above described embodiments as described below.

The third to eighth embodiments may be applied with the same modification as the modification from the first embodiment to the second embodiment.

The second, and fourth to eighth embodiments may be applied with the same modification as the modification from the first embodiment to the third embodiment.

The second, third, and fifth to eighth embodiments may be applied with the same modification as the modification from the first embodiment to the fourth embodiment.

The fifth to eighth embodiments may be modified in circuitry so as to be capable of detecting poor conductivity of the detection lines.

In the sixth embodiment, the number of the diodes 58 may be changed as necessary. However, in this case, the sixth embodiment needs to be able to keep the transistor 51 in an off state without fail when the detection line L9 is not broken, for example, by setting the voltage between the detection line L9 and the cathode of the diode 55 lower than the overdischarge threshold VthL. The means for generating the reference voltage is not limited to the diode. For example, a thyristor may be used for this means. In this case, since the thyristor may be used as means for opening and closing the current path of the reference generating means, the switching element 57 can be eliminated.

In the seventh embodiment, the number of the diodes D used to generate the reference voltage may be changed. However, it should be noted that since if an excessively large number of the diodes D are used, the electrostatic protection function is lowered, the number of the diodes D should be set within a range in which the electrostatic protection function can be ensured.

In the fifth to seventh embodiments, presence of polarity inversion may be determined by use of the reference voltage used in the eighth embodiment.

The hysteresis comparator in the eighth embodiment may be configured to be applied with the reference voltage used in the fifth to seventh embodiments. In other words, in the fifth to seventh embodiments, the polarity inversion detecting circuit may be configured as a hysteresis comparator not including the transistor 51.

Figure 25:
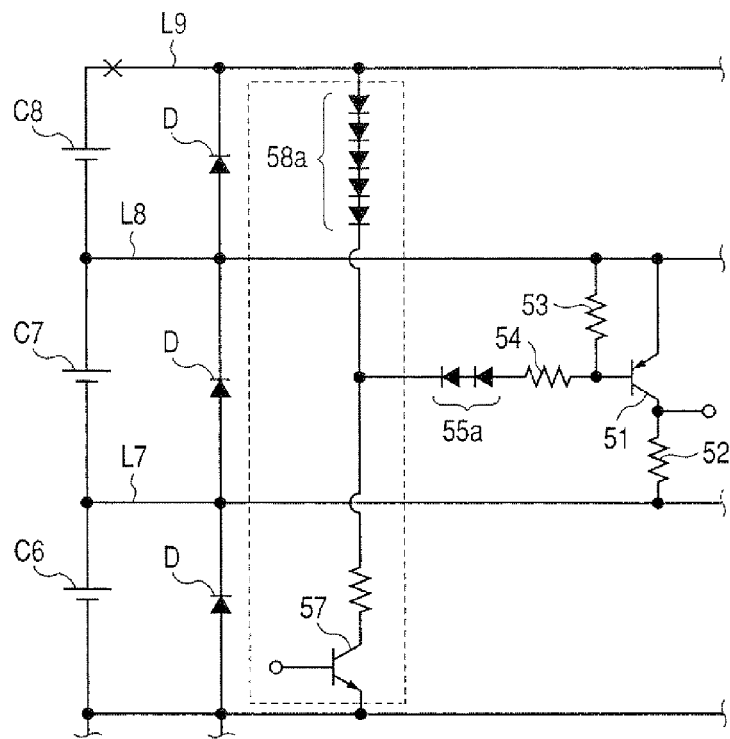
FIG. 25 is a diagram showing a circuit structure of a polarity inversion detecting circuit included in a modification of the abnormality detection apparatus according to the sixth embodiment of the invention.
Figure 26:
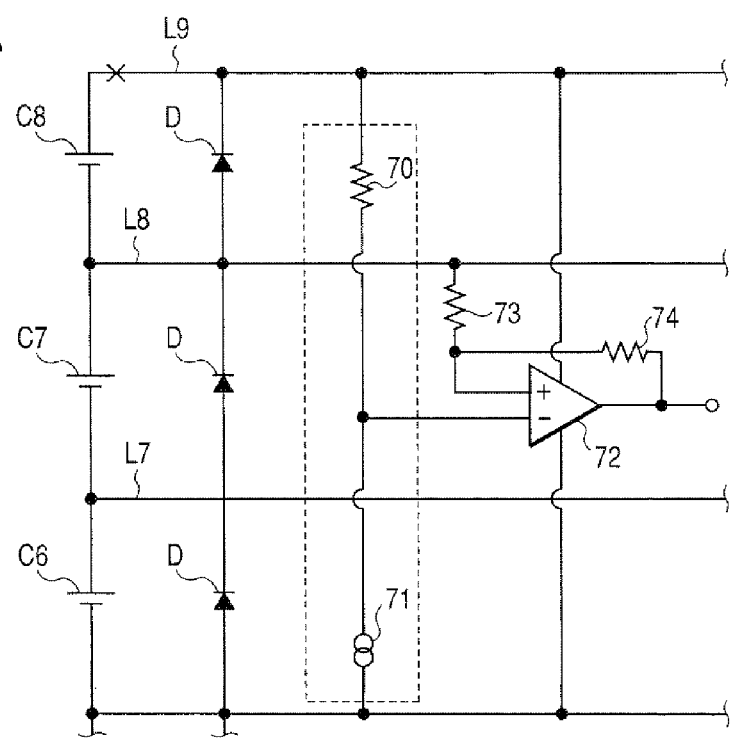
FIG. 26 is a diagram showing a circuit structure of a polarity inversion detecting circuit included in a modification of the abnormality detection apparatus according to the eighth embodiment of the invention.
Figure 27:
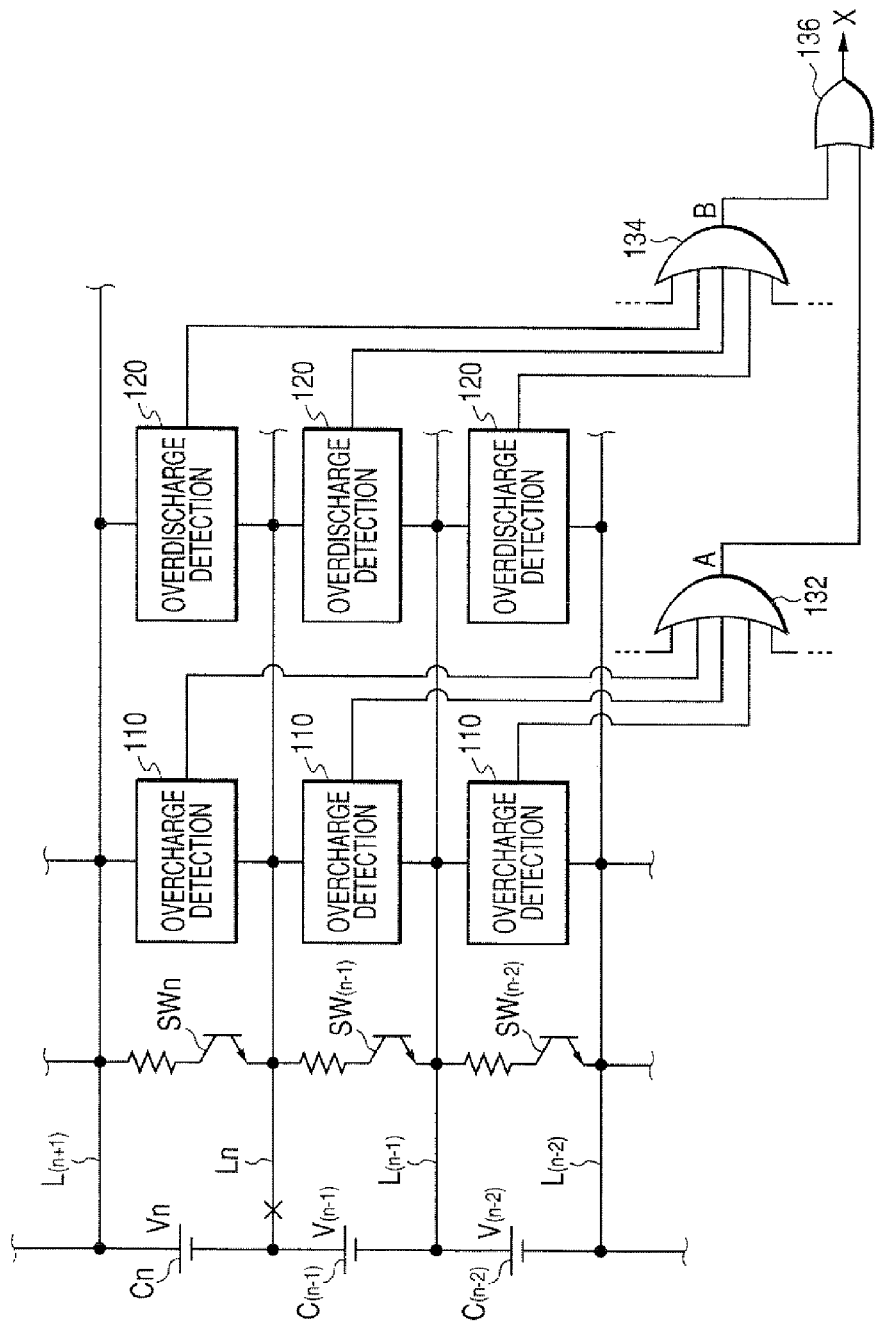
FIG. 27 is diagram showing a part of an equivalent circuit of a conventional abnormality detection apparatus.

The reference voltage generating means in the above embodiments is not limited to the one which takes in the voltage between two of the battery cells at its input terminal. For example, it may be configured to take in the voltages among three of the battery cells at its input terminal as shown in FIG. 25 or FIG. 26. FIG. 25 shows a modification of the sixth embodiment, and FIG. 26 shows a modification of the eighth embodiment. In FIG. 25, the number of the diodes 58a for generating the reference voltage may be changed as necessary. However, when this number is increased, the number of the backflow preventing diodes 55a shown in FIG. 25 needs to be increased so that the transistor 51 can be kept off when the detection line L9 is normal (not broken). In FIG. 25, the reference voltage generating means may be replaced with the one constituted by the resistor 70 and the constant current source 71 as shown in FIG. 26. In FIG. 26, the reference voltage generating means may be replaced with the one constituted by the diodes 58a, and D as shown in FIG. 25.

The second to eighth embodiments may be applied with the same modification as the modification from the first embodiment to the ninth embodiment. In the fifth to eights embodiments modified as above, it can be determined that the detection line L9 or L1 is broken when the polarity inversion detecting circuit 50 or 60 detects polarity inversion irrespective the voltage history of the detection line L9 or L1. Accordingly, the line breakage detection process may be inhibited after the polarity inversion detecting circuit 50 or 60 detects polarity inversion.

In the ninth embodiment, the structure of the voltage threshold determining sections 90 is not limited to the one shown in FIG. 18. For example, it may be configured to compare the voltage across the battery cell Cn with each of four or more different level threshold voltages. In other words, the voltage across the battery cell Cn may be converted not by the A/D converter configured to output digital data representing the voltage in three bits, but a different A/D converter configured to output the digital data in four or more bits.

In the ninth embodiment, the voltage variation may be quantified not in digital form, but in analogue form. In this case, it becomes possible to more accurately determine presence of a line breakage by detecting whether the increase rate of the voltage variation is greater than a predetermined rate. In this case, instead of the band-pass filter, a low-pass filter may be used to remove the effect of noise.

In the ninth embodiment, instead of high-pass filtering the difference between the logical sum Vmax outputted from the OR circuit 92 and the logical product Vmin outputted from the AND circuit 94 by use of the band-pass filter, the output of the voltage threshold determining sections 90 may be directly high-pass filtered.

In the ninth embodiment, instead of low-pass filtering the difference between the logical sum Vmax outputted from the OR circuit 92 and the logical product Vmin outputted from the AND circuit 94 by use of the band-pass filter, the output of the voltage threshold determining sections 90 may be directly low-pass filtered.

The second to eighth embodiments may be applied with the same modification as the modification from the first embodiment to the tenth embodiment. In the fifth to eights embodiments modified as above, it can be determined that the detection line L9 or L1 is broken when the polarity inversion detecting circuit 50 or 60 detects polarity inversion irrespective the voltage history of the detection line L9 or L1. Accordingly, the line breakage detection process may be inhibited after the polarity inversion detecting circuit 50 or 60 detects polarity inversion.

The tenth embodiment is configured not to perform the line breakage detecting process if it is detected that an overcharge condition continues longer than the predetermined time period. However, in the structure including the voltage threshold determining sections 90, if the lowest one of the voltages across the battery cells rapidly falls, the line breakage detecting process may be inhibited, assuming that one of the battery cells has malfunctioned after being overcharged, and is in an overdischarged state. When an overcharged condition is detected, the line breakage detecting process may be inhibited for some time. It is preferable that the line breakage detecting process is inhibited until both the overcharge condition and overdischarge condition disappear.

The method of determining presence of a line breakage on the basis of the voltage history of the battery cell before the logical product Y becomes logical "H" is not limited to the one described in the ninth or tenth embodiment or their modifications. For example, presence of a line breakage may be determined depending on whether at least one of the minimum value and the maximum value of the voltages across the battery cells immediately before the logical product Y becomes logical "H" is in a specified range. For example, if the maximum value is equal to or larger than a first value, and the minimum value is equal to or smaller than a second value smaller than the first value immediately before the logical product Y becomes logical "H", it may be determined that a line breakage is not present, because it is likely that the logical product Y has become logical "H" due to increase of the voltage variation thereafter.

The equalized discharge process may be performed not only while the start permission switch is in the off state, but also while the start permission switch is in the on state.

Although each of the logical sum A and the logical sum B is produced from the outputs of all the overcharge detecting circuits 10 and the overdischarge detecting circuits 20 in the above embodiments, it is possible to determine presence of a line breakage on the basis of a logical sum of the outputs of adjacent two of the overcharge detecting circuits 10 and a logical sum of the outputs of adjacent two of the overdischarge detecting circuits 20 with reference to the relationship shown in FIG. 5.

It is not necessarily needed to provide the means for detecting an overcharge condition and the means for detecting an overdischarge condition separately. For example, if each of the two input terminals of the comparator 40 of the overcharge detecting circuit 10 shown in FIG. 8A is provided with a 2-way switchable switch, it is possible to detect both an overcharge condition and an overdischarge condition by the overcharge detecting circuit 10 alone.

The means for short-circuiting adjacent two of the detection lines is not limited to the one used in the above embodiments. For example, it may include a resistor in addition to the constant current source CCS and the switching element Swn shown in FIG. 9. The switching element SWn may be constituted by a MOS transistor instead of the bipolar transistor.

The voltage variation of the battery cells C1 to C8 may be removed by a process other than the foregoing equalized discharge process. For example, the voltage variation may be removed by moving the charge of the battery cell having a high voltage to the battery cell having a low voltage.

The detection line is not necessarily provided for each one of the battery cells. For example, the detection line may be provided for each one of blocks including a predetermined number of the battery cells.

The battery cell is not limited to a lithium rechargeable battery. The present invention is applicable to any battery pack in which a voltage detection line is provided for each of battery cells, or for each of unit batteries which include the same number of battery cells.

Although the above embodiments are applied to a hybrid vehicle, the present invention is applicable to an electric vehicle.

The above explained preferred embodiments are exemplary of the invention of the present application which is described solely by the claims appended below. It should be understood that modifications of the preferred embodiments may be made as would occur to one of skill in the art.

What is claimed is:

1. An abnormality detection apparatus for a battery pack including a plurality of unit batteries each of which is constituted by one, or adjacent two or more of battery cells, the abnormality detection apparatus being connected through detection lines to both electrodes of each of the unit batteries, and configured to detect a voltage across each of the unit batteries on the basis of voltages between each two adjacent detection lines, the abnormality detection apparatus comprising:
   a first determining function of making a first determination that abnormality is present when a voltage across a unit battery of interest is higher than a first threshold;
   a second determining function of making a second determination that abnormality is present when the voltage across the unit battery of interest is lower than a second threshold lower than the first threshold;
   a short-circuit function of making a short-circuit between a detection line of interest connected to one electrode of a unit battery of interest and an adjacent detection line connected to the other electrode of the unit battery of interest;
   a third determining function of making a third determination that there is faulty electrical continuity in the detection line of interest if the first determining function makes the first determination and the second determining function makes the second determination when the short circuit function makes the short-circuit; and
   a fourth determining function of making a fourth determination on presence of at least one of an overcharge condition and an overdischarge condition of the unit battery of interest on the basis of a determination result of at least one of the first and second determining functions, on condition that the third determining function does not make the third determination.

2. The abnormality detection apparatus according to claim 1, further comprising a fifth determining function of making a fifth determination that the detection line of interest has faulty electrical continuity when polarity inversion occurs between the detection line of interest and the adjacent line.

3. The abnormality detection apparatus according to claim 2, wherein the fifth determining function includes a polarity inversion detecting circuit having first and second input terminals respectively connected to the detection line of interest and the adjacent detection line, and configured to determine that the polarity inversion has occurred when a voltage between the first and second input terminals is at a reference voltage,
   the abnormality detection apparatus further comprising a reference voltage generating function of bringing the voltage between the first and second input terminals to the reference voltage when the detection line of interest is broken.

4. The abnormality detection apparatus according to claim 3, wherein the reference voltage generating function includes a rectifying device connected between the detection line of interest and the second input terminal of the polarity inversion detecting circuit.

5. The abnormality detection apparatus according to claim 4, wherein the rectifying device include a plurality of series-connected diodes.

6. The abnormality detection apparatus according to claim 3, wherein the reference voltage generating function includes a series connection of a resistor and a constant current source connected between the detection line of interest and the adjacent detection line.

7. The abnormality detection apparatus according to claim 3, wherein the reference voltage generating function further includes a function of opening and closing a current path thereof.

8. The abnormality detection apparatus according to claim 3, wherein the polarity inversion detecting circuit detects the polarity inversion on the basis of a magnitude relationship between voltages respectively applied to the first and second input terminals.

9. The abnormality detection apparatus according to claim 8, wherein the polarity inversion detecting circuit includes a transistor whose on/off state depends on the magnitude relationship, and whose output makes an output signal of the polarity inversion detecting circuit.

10. The abnormality detection apparatus according to claim 8, wherein the polarity inversion detecting circuit includes a hysteresis comparator performing comparison between the voltages respectively applied to first and second input terminals.

11. The abnormality detection apparatus according to claim 1, further comprising a switching function of switching at least one of the first and second threshold values between two different values.

12. The abnormality detection apparatus according to claim 1, further comprising a voltage variation reducing function of reducing variation in voltage among the unit batteries.

13. The abnormality detection apparatus according to claim 1, wherein when the first determining function makes the first determination and the second determining function makes the second determination, the third determining function makes the third determination depending on voltage history of the unit batteries before making the third determination.

14. The abnormality detection apparatus according to claim 13, wherein the third determining function includes a quantification function of quantifying voltage variation among the unit batteries, and is configured to make the third determination if the first determining function makes the first determination and the second function makes the second determination, only on condition that the quantification function detects that the voltage variation is not in an increase trend.

15. The abnormality detection apparatus according to claim 14, wherein the quantification function has a function of high-pass filtering a signal representing the voltage variation.

16. The abnormality detection apparatus according to claim 14, wherein the quantification has a function of low-pass filtering the signal representing the voltage variation.

17. The abnormality detection apparatus according to claim 13, wherein when the first determining function makes the first determination and the second functions makes the second determination, the third determining function makes the third determination depending on a prior determination result of the first determining function before making the third determination.

18. The abnormality detection apparatus according to claim 17, wherein the third determining function makes the third determination, if the first determining function makes the first determination and second determining function makes the second determination, on condition that the first determination was not made over a predetermined time period before the third determining function makes the third determination.

19. The abnormality detection apparatus according to claim 1, wherein the short-circuit function includes a series connection of a constant current source and a switching element.

20. The abnormality detection apparatus according to claim 1, wherein the short-circuit function includes a series connection of a resistor and a switching element.

21. The abnormality detection apparatus according to claim 1, further comprising means for inhibiting a determination of presence or absence of overcharged condition and overdischarged condition on the unit batteries from being made when there is a determination of faulty electrical continuity in at least one of the detection lines.

22. The abnormality detection apparatus according to claim 21, further comprising:
means for generating a logical product and a logical sum of the output signals of the first and second determining functions; wherein:
the determination of faulty electrical continuity in the at least one detection line is made based on the logical product, and
the determination on at least one of the overcharged condition and overdischarged condition is made based on the logical sum.

23. An abnormality detection apparatus for a battery pack including a plurality of unit batteries each of which is constituted by one, or adjacent two or more of battery cells, the abnormality detection apparatus being connected through detection lines to both electrodes of each of the unit batteries, and configured to detect a voltage across each of the unit batteries on the basis of voltages between each two adjacent detection lines, the abnormality detection apparatus comprising a control device configured to:
make a first determination that abnormality is present when a voltage across a unit battery of interest is higher than a first threshold;
make a second determination that abnormality is present when the voltage across the unit battery of interest is lower than a second threshold lower than the first threshold;
make a short-circuit between a detection line of interest connected to one electrode of a unit battery of interest and an adjacent detection line connected to the other electrode of the unit battery of interest;
make a third determination that there is faulty electrical continuity in the detection line of interest if the first determination is made and the second determination is made when the short-circuit is made; and
make a fourth determination on presence of at least one of an overcharge condition and an overdischarge condition of the unit battery of interest on the basis of a determination result of at least one of the first and second determinations, on condition that the third determination is not made.

24. The abnormality detection apparatus according to claim 23, wherein the control device is further configured to make a fifth determination that the detection line of interest has faulty electrical continuity when polarity inversion occurs between the detection line of interest and the adjacent line.

25. The abnormality detection apparatus according to claim 24, wherein:
the fifth determination includes determining that a polarity inversion has occurred using a detecting circuit having first and second input terminals respectively connected to the detection line of interest and the adjacent detection line, the polarity inversion having occurred when a voltage between the first and second input terminals is at a reference voltage,
the voltage between the first and second input terminals is brought to a reference voltage when the detection line of interest is broken.

26. The abnormality detection apparatus according to claim 23, wherein the control device is further configured to switch at least one of the first and second threshold values between two different values.

27. The abnormality detection apparatus according to claim 23, wherein when the first determination is made and the second determination is made, the third determination is made depending on voltage history of the unit batteries before making the third determination.

28. The abnormality detection apparatus according to claim 27, wherein the third determination includes quantifying voltage variation among the unit batteries, and the third determination is made if the first determination is made and the second determination is made, only on condition that the voltage variation is not in an increase trend.

29. The abnormality detection apparatus according to claim 23, wherein the control device is further configured to inhibit a determination of presence or absence of overcharged condition and overdischarged condition on the unit batteries from being made when a faulty electrical continuity in the detection lines is determined.

30. The abnormality detection apparatus according to claim 29, wherein:
the control device is further configured to generate a logical product and a logical sum of the output signals of the first and second determinations,
the determination of faulty electrical continuity in a least one of the detection lines is made based on the logical product, and
the determination on at least one of the overcharged condition and overdischarged condition is made based on the logical sum.

* * * * *